(12) United States Patent
Park et al.

(10) Patent No.: US 7,888,148 B2
(45) Date of Patent: Feb. 15, 2011

(54) SIGNAL LINE FOR A DISPLAY DEVICE, ETCHANT, THIN FILM TRANSISTOR PANEL, AND METHOD FOR MANUFACTURING THE SAME

(75) Inventors: Hong-Sick Park, Suwon-si (KR);
Bong-Kyun Kim, Incheon-si (KR);
Chang-Oh Jeong, Suwon-si (KR);
Jong-Hyun Choung, Suwon-si (KR);
Sun-Young Hong, Seoul (KR);
Won-Suk Shin, Yongin-si (KR);
Byeong-Jin Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 665 days.

(21) Appl. No.: 11/850,922

(22) Filed: Sep. 6, 2007

(65) Prior Publication Data

US 2008/0079006 A1 Apr. 3, 2008

(30) Foreign Application Priority Data

Sep. 29, 2006 (KR) .................... 10-2006-0095979

(51) Int. Cl.
*H01L 21/00* (2006.01)
(52) U.S. Cl. ............... 438/29; 438/656; 257/E21.156; 257/E21.414
(58) Field of Classification Search ............ 438/29, 438/656; 257/E21.156, E21.414
See application file for complete search history.

(56) References Cited

U.S. PATENT DOCUMENTS 6,333,518 B1 12/2001 Seo

| | | | |
|---|---|---|---|
| 7,061,565 B2* | 6/2006 | Kwon et al. | 349/139 |
| 7,586,197 B2* | 9/2009 | Lee et al. | 257/762 |
| 2004/0262569 A1 | 12/2004 | Cho et al. | |
| 2006/0091396 A1 | 5/2006 | Lee et al. | |
| 2007/0122649 A1* | 5/2007 | Lee et al. | 428/674 |

FOREIGN PATENT DOCUMENTS

| | | |
|---|---|---|
| JP | 2001059191 | 3/2001 |
| JP | 2004133422 | 4/2004 |
| JP | 2004193620 | 7/2004 |
| JP | 2004253511 | 9/2004 |
| JP | 2005057260 | 3/2005 |
| KR | 1020030048606 | 6/2003 |
| KR | 1020040070989 | 8/2004 |
| KR | 100480797 | 3/2005 |
| KR | 1020050067934 | 7/2005 |
| KR | 1020060023697 | 3/2006 |
| KR | 1020060027918 | 3/2006 |

* cited by examiner

*Primary Examiner*—Trung Dang
(74) *Attorney, Agent, or Firm*—Cantor Colburn LLP

(57) ABSTRACT

A thin film panel includes a substrate, a gate line formed on the substrate, a gate insulating layer formed on the gate line, a semiconductor layer formed on the gate insulating layer, a data line, including a source electrode, and a drain electrode formed on the gate insulating layer or the semiconductor layer, and a pixel electrode connected to the drain electrode, wherein at least one of the gate line and the data line and drain electrode includes a first conductive layer made of a molybdenum Mo-niobium Nb alloy and a second conductive layer made of a copper Cu-containing metal.

4 Claims, 35 Drawing Sheets

*FIG. 34*

| | Etch conditions | Skew | | |
|---|---|---|---|---|
| | | Mo\Cu | Mo\Cu\CuN\Mo | MoNb\Cu |
| Gate lines | a | 1.15 | 2.02 | 0.95 |
| | b | 1.31 | 2.20 | 1.16 |
| | c | 1.44 | 2.43 | 1.32 |
| | d | 1.61 | 2.75 | 1.474 |
| Data lines | e | 1.1 | 1.4 | 0.898 |
| | f | 1.13 | 1.78 | 0.931 |
| | g | 1.27 | 2.03 | 1.008 |
| | h | 1.45 | 2.37 | 1.067 |

FIG. 35
| | | Remnants & Tail | | |
|---|---|---|---|---|
| | | Mo/Cu | Mo/Cu/Cun/Mo | MoNb/Cu |
| Gate lines | 1 | 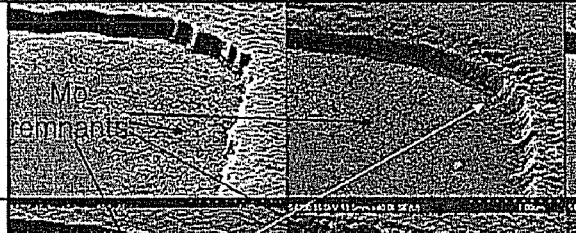 | 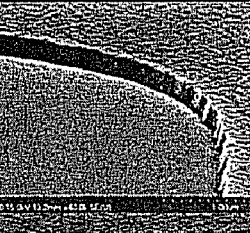 | 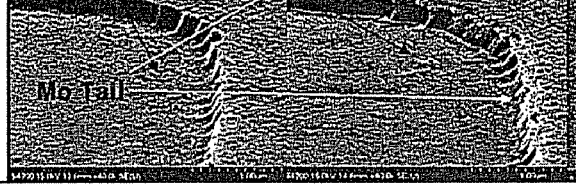 |
| Data lines | 2 |  | | |

SIGNAL LINE FOR A DISPLAY DEVICE, ETCHANT, THIN FILM TRANSISTOR PANEL, AND METHOD FOR MANUFACTURING THE SAME

This application claims priority to Korean patent application No. 10-2006-0095979, filed on Sep. 29, 2006, and all the benefits accruing therefrom under 35 U.S.C. §119, the contents of which in its entirety are herein incorporated by reference.

BACKGROUND OF THE INVENTION (a) Field of the Invention

The present invention relates to a signal line for a display device, etchant, thin film transistor panel, and a method for manufacturing the same. More particularly, the present invention relates to a signal line for a display device having low line resistance and increased reliability, etchant, thin film transistor panel, and a method for manufacturing the same.

(b) Description of the Related Art

Generally, a flat panel display such as a liquid crystal display ("LCD"), an organic light emitting diode ("OLED") display, and an electrophoretic display includes a pair of electric-field generating electrodes and an electro-optical active layer disposed therebetween. The LCD includes a liquid crystal layer as the electro-optical active layer, and the OLED display includes an organic light emitting layer as the electro-optical active layer.

One of the pair of field generating electrodes is usually coupled with a switching element to receive electrical signals, and the electro-optical active layer converts the electrical signals into optical signals to display images.

The switching element for the flat panel display includes a thin film transistor ("TFT") having three terminals, and gate lines transmitting control signals for controlling the TFTs and data lines transmitting data signals to be supplied for the pixel electrodes through the TFTs are also provided in the flat panel display.

The gate lines and the data lines are lengthened when increasing the size of the flat panel display such that the line resistance of the gate and data lines is increased. Accordingly, to solve a signal delay due to the increase of the line resistance, the signal lines are generally made of a material having low resistivity.

However, the material having low resistivity has poor physical and chemical characteristics such as against external impact and durability such that its contact with other materials is easily corroded. As a result, the line resistance of the signal lines is not decreased. Furthermore, remnants and skews are greatly generated in a manufacturing process using the materials such that the reliability for the material of the signal lines is deteriorated.

BRIEF SUMMARY OF THE INVENTION

The present invention provides a thin film transistor ("TFT") array and a method for manufacturing the same to achieve low line resistance and reliability for the material of the signal lines. The present invention also provides a signal line for a display device having low line resistance and increased reliability, and an etchant for use in the manufacture of a display device having the signal line.

According to exemplary embodiments of the present invention, a signal line includes a first conductive layer made of a molybdenum Mo-niobium Nb alloy, and a second conductive layer made of a copper Cu-containing metal. The first conductive layer may be disposed under the second conductive layer. The signal line may further include a third conductive layer made of a Mo—Nb alloy and disposed on the second conductive layer. The signal line may be a gate line or a data line transmitting a signal to a thin film transistor ("TFT") of the display device.

According to other exemplary embodiments of the present invention, an etchant includes benzotriazole, citric acid, hydrogen peroxide, hydrofluoric acid, and deionized water. The etchant may include benzotriazole at about 0.1 to 1 wt %, citric acid at about 1 to 5 wt %, hydrogen peroxide at about 10 to 20 wt %, hydrofluoric acid at about 0.01 to 0.5 wt %, and deionized water for a remainder of the etchant.

According to still other exemplary embodiments of the present invention, a TFT array panel includes a substrate, a gate line formed on the substrate, a gate insulating layer formed on the gate line, a semiconductor layer formed on the gate insulating layer, a data line, including a source electrode, and a drain electrode formed on the gate insulating layer or the semiconductor layer, and a pixel electrode connected to the drain electrode. At least one of the gate line and the data line and drain electrode includes a first conductive layer made of a Mo—Nb alloy and a second conductive layer made of a Cu-containing metal.

The first conductive layer may be disposed under the second conductive layer. The TFT array panel may further include a third conductive layer made of a Mo—Nb alloy and disposed on the second conductive layer.

The TFT array panel may further include ohmic contacts formed between the data line and drain electrode, and the semiconductor layer. The semiconductor layer may include a first portion having a substantially same planar shape as the data line and the drain electrode, and a second portion not covered by the data line and the drain electrode and disposed between the source electrode and the drain electrode.

According to yet other exemplary embodiments of the present invention, a method for forming a TFT array panel includes forming a gate line on a substrate, forming a gate insulating layer on the gate line, forming a semiconductor layer on the gate insulating layer, forming a data line, including a source electrode, and a drain electrode on the gate insulating layer or the semiconductor layer, and forming a pixel electrode connected to the drain electrode, wherein at least one of the gate line and the data line and drain electrode includes a first conductive layer made of a Mo—Nb alloy and a second conductive layer made of a Cu-containing metal.

The first conductive layer may be disposed under the second conductive layer. At least one of the gate line and the data line and drain electrode may further include a third conductive layer made of a Mo—Nb alloy disposed on the second conductive layer.

The first and second conductive layers may be etched under the same etch condition. The etch condition may be wet etching, and an etchant of the wet etching includes benzotriazole, citric acid, hydrogen peroxide, hydrofluoric acid, and deionized water. The etchant may include benzotriazole at about 0.1 to 1 wt %, citric acid at about 1 to 5 wt %, hydrogen peroxide at about 10 to 20 wt %, hydrofluoric acid at about 0.01 to 0.5 wt % and deionized water for a remainder of the etchant.

According to still other exemplary embodiments of the present invention, a TFT array panel includes a plurality of signal lines defining a plurality of pixel regions, wherein the signal lines include a first conductive layer made of a molybdenum Mo-niobium Nb alloy and a second conductive layer made of a copper Cu-containing metal.

The signal lines may further include a third conductive layer made of a molybdenum Mo-niobium Nb alloy, and the second conductive layer may be sandwiched between the first and second conductive layers.

The signal lines may include a plurality of gate lines and a plurality of data lines intersecting the gate lines.

BRIEF DESCRIPTION OF THE DRAWINGS

The above and other features and advantages of the present invention will become more apparent by describing preferred and exemplary embodiments thereof in detail with reference to the accompanying drawings, in which:

FIG. 34 is a graph showing skews of the exemplary gate line and the exemplary data line etched by using the exemplary etchant according to the exemplary embodiment of the present invention; and FIG. 35 is a photograph showing the remnant and the tails of the exemplary gate line and the exemplary data line etched by using the exemplary etchant according to the exemplary embodiment of the present invention.

DETAILED DESCRIPTION OF THE INVENTION

Figure 1:
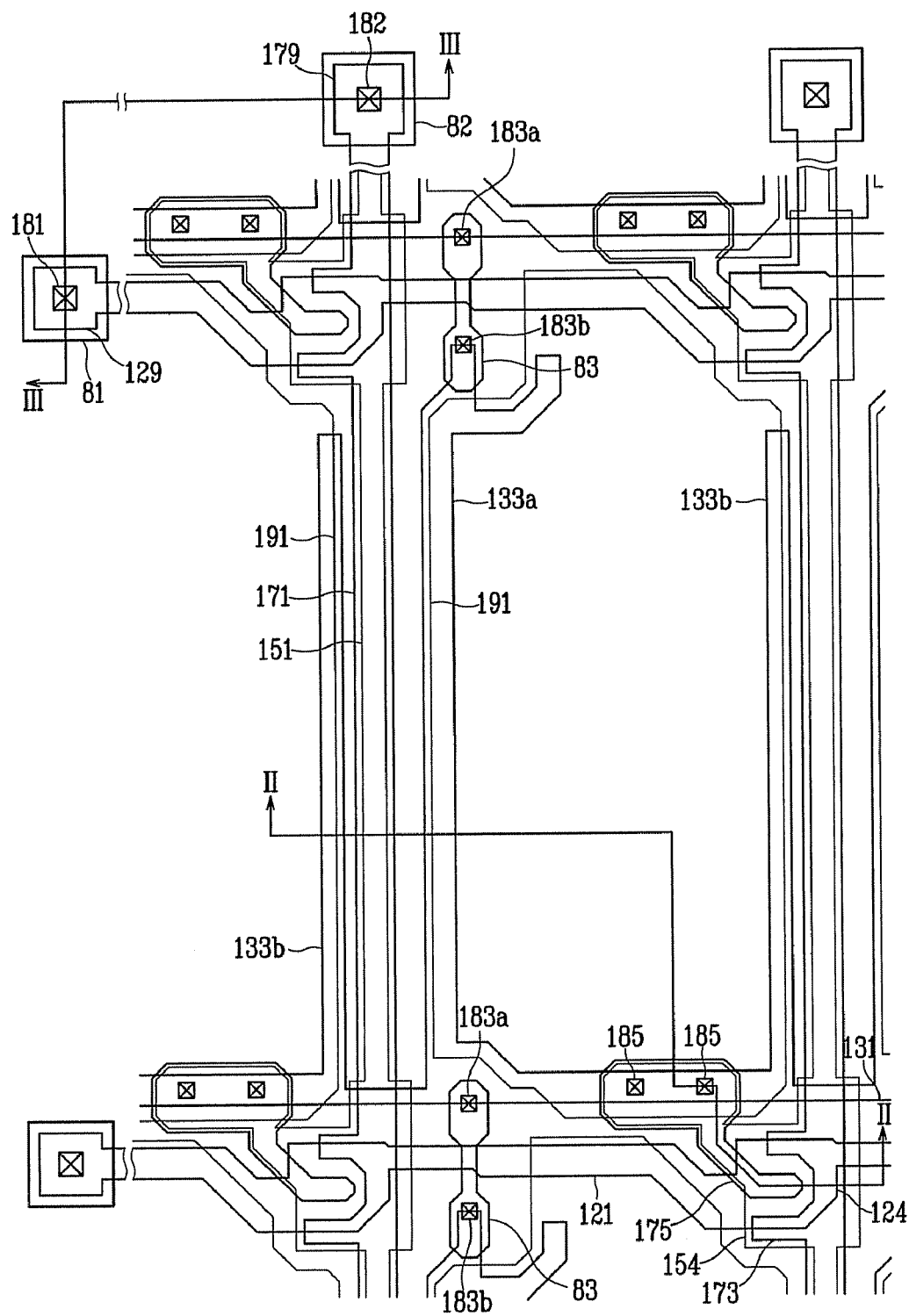
FIG. 1 is an exemplary layout view of an exemplary thin film transistor ("TFT") array panel for an exemplary liquid crystal display ("LCD") according to an exemplary embodiment of the present invention.

The present invention will be described more fully hereinafter with reference to the accompanying drawings, in which preferred and exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

A thin film transistor ("TFT") array panel according to an exemplary embodiment of the present invention will now be described in detail with reference to FIGS. 1 to 3.

Figure 2:
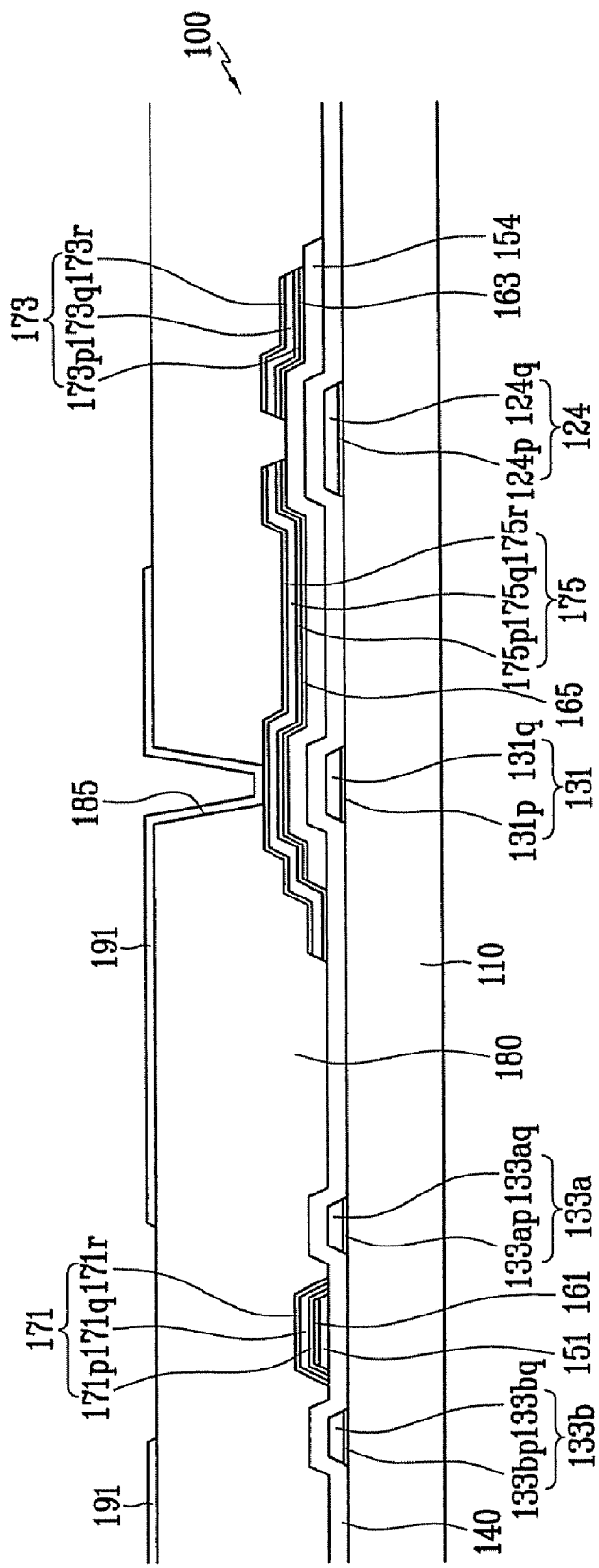
FIGS. 2 and 3 are sectional views of the exemplary TFT array panel shown in FIG. 1, taken along lines II-II and III-III, respectively.
Figure 3:
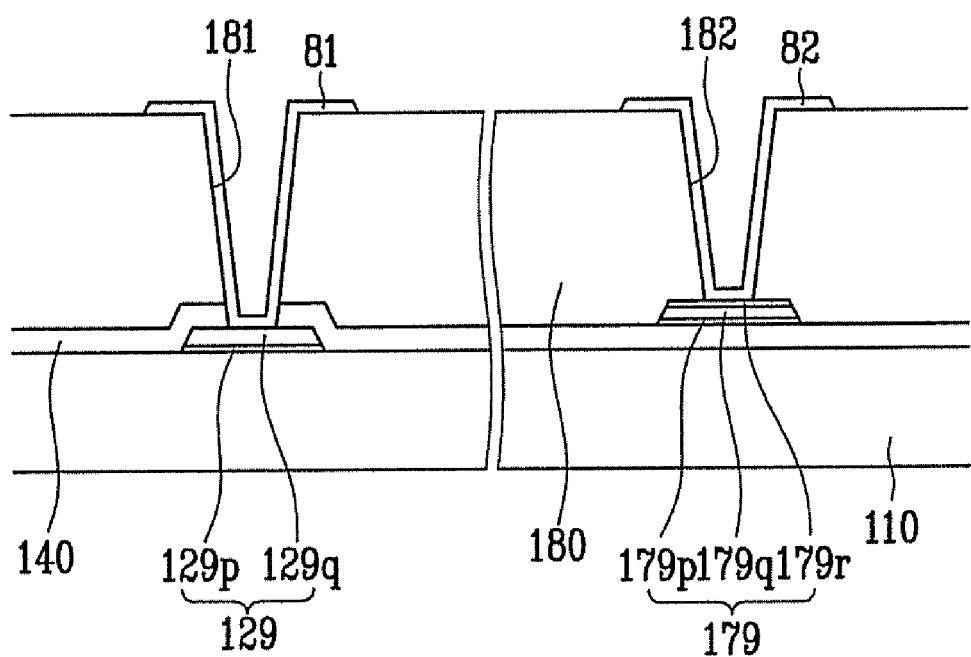

FIG. 1 is a layout view of an exemplary TFT array panel for a liquid crystal display ("LCD") according to an exemplary embodiment of the present invention, and FIGS. 2 and 3 are sectional views of the exemplary TFT array panel shown in FIG. 1, taken along lines II-II and III-III.

A plurality of gate lines 121 and a plurality of storage electrode lines 131 are formed on an insulating substrate 110 made of a material such as, but not limited to, transparent glass or plastic.

The gate lines 121 transmit gate signals and extend substantially in a transverse direction, a first direction. Each of the gate lines 121 includes a plurality of gate electrodes 124 projecting downward towards an adjacent gate line 121 and an end portion 129 having a large area for contact with another layer or an external driving circuit. A gate driving circuit (not shown) for generating the gate signals may be mounted on a flexible printed circuit ("FPC") film (not shown), which may be attached to the substrate 110, directly mounted on the substrate 110, or integrated with the substrate 110. The gate lines 121 may extend to be connected to a driving circuit that may be integrated with the substrate 110.

The storage electrode lines 131 are supplied with a predetermined voltage, and each of the storage electrode lines 131 includes a stem extending substantially parallel to the gate lines 121 and a plurality of pairs of storage electrodes 133a and 133b branched from the stems. Each of the storage electrode lines 131 is disposed between two adjacent gate lines 121, and a stem thereof is close to one of the two adjacent gate lines 121. Each of the storage electrodes 133a and 133b has a fixed end portion connected to the stem and a free end portion disposed opposite thereto. The fixed end portion of the storage electrode 133b has a large area, and the free end portion thereof is bifurcated into a linear branch and a curved branch. However, the storage electrode lines 131 may have various shapes and arrangements.

The gate lines 121 and the storage electrode lines 131 include lower layers 124p, 129p, 131p, 133ap, and 133bp that are preferably made of a molybdenum Mo-containing metal such as Mo and a Mo alloy, and upper layers 124q, 129q, 131q, 133aq, and 133bq which are preferably made of a copper Cu-containing metal such as Cu and a Cu alloy. The Mo alloy is preferably a molybdenum-niobium Mo—Nb alloy including Mo and a small quantity of Nb. It is preferable that the thickness of the lower layers 124p, 129p, 131p, 133ap, and 133bp is in the range of about 50 to 500 angstroms, more particularly 100 to 300 angstroms, and that the thickness of the upper layers 124q, 129q, 131q, 133aq, and 133bq is in the range of about 1000 to 3000 angstroms, more particularly 1500 to 2500 angstroms.

As shown in FIGS. 2 and 3, the lower layers and the upper layers of the gate electrodes 124, the end portions 129, the storage electrode lines 131, and the storage electrodes 133a and 133b are respectively denoted by adding "p" and "q" to the reference numbers of the gate electrodes 124, the end portions 129, the storage electrode lines 131, and the storage electrodes 133a and 133b, respectively. The remainder of the gate lines 121, although not shown in cross-section, may also have the lower and upper layers p and q as described above.

The Mo—Nb alloy layers 124p, 129p, 131p, 133ap, and 133bp have a function of a barrier metal layer that reinforces adhesion between the Cu layers 124q, 129q, 131q, 133aq, and 133bq, and the substrate 110 for preventing peeling and lifting, and prevent the Cu material of the upper layers 124q, 129q, 131q, 133aq, and 133bq from oxidizing and diffusing to the substrate 100.

Although not shown, Mo—Nb layers may be added as capping layers on the upper layers 124q, 129q, 131q, 133aq, and 133bq to protect the upper layers 124q, 129q, 131q, 133aq, and 133bq having poor quality for chemical resistance.

The lateral sides of the gate lines 121 and the storage electrode lines 131 are inclined relative to a surface of the substrate 110, and the inclination angle thereof is in a range of about 30 to about 80 degrees.

A gate insulating layer 140 preferably made of silicon nitride (SiNx) or silicon oxide (SiOx) is formed on the gate lines 121, the storage electrode lines 131, and on the exposed portions of the substrate 110.

A plurality of semiconductor stripes 151 preferably made of hydrogenated amorphous silicon ("a-Si") or polysilicon are formed on the gate insulating layer 140. The semiconductor stripes 151 extend substantially in the longitudinal direction, a second direction substantially perpendicular to the first direction, and become wide near the gate lines 121 and the storage electrode lines 131 such that the semiconductor stripes 151 cover large areas of the gate lines 121 and the storage electrode lines 131. Each of the semiconductor stripes 151 includes a plurality of projections 154 branched out toward the gate electrodes 124 such that they overlap the gate electrodes 124.

A plurality of ohmic contact stripes and islands 161 and 165 are formed on the semiconductor stripes 151. The ohmic contact stripes and islands 161 and 165 are preferably made of n+ hydrogenated a-Si heavily doped with an N-type impurity such as phosphorous, or they may be made of silicide. Each ohmic contact stripe 161 includes a plurality of projections 163, and the projections 163 and the ohmic contact islands 165 are located in pairs on the projections 154 of the semiconductor stripes 151, such that they are spaced apart on the projections 154.

The lateral sides of the semiconductor stripes 151 and the ohmic contacts 161 and 165 are inclined relative to the surface of the substrate 110, and the inclination angles thereof are preferably in a range of about 30 to about 80 degrees.

A plurality of data lines 171 and a plurality of drain electrodes 175 are formed on the ohmic contacts 161 and 165 and the gate insulating layer 140.

The data lines 171 transmit data signals and extend substantially in the longitudinal direction, the second direction, to intersect the gate lines 121. Each data line 171 also intersects the storage electrode lines 131 and runs between adjacent pairs of storage electrodes 133a and 133b. Each data line 171 includes a plurality of source electrodes 173 projecting toward the gate electrodes 124 and being curved like a crescent, and an end portion 179 having a large area for contact with another layer or an external driving circuit. A data driving circuit (not shown) for generating the data signals may be mounted on an FPC film (not shown), which may be attached to the substrate 110, directly mounted on the substrate 110, or integrated with the substrate 110. The data lines 171 may extend to be connected to a driving circuit that may be integrated with the substrate 110.

The drain electrodes 175 are separated from the data lines 171 and disposed opposite the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a respective source electrode 173 having the crescent or "U" shape.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 preferably include three conductive layers, such as a lower layer 171p, 175p, a middle layer 171q, 175q, and an upper layer 171r, 175r. It is preferable that the lower layer 171p, 175p is made of a Mo-containing metal such as pure Mo, a molybdenum nitride alloy Mo—N, a Mo—Nb alloy, a molybdenum vanadium alloy Mo—V, a molybdenum titanium alloy Mo—Ti, and a molybdenum tungsten alloy Mo—W, that the middle layer 171q, 175q is made of a low resistivity metal such as a Cu-containing metal such as pure Cu and a Cu alloy for reducing signal delay or voltage drop, and that the upper layer 171r, 175r is made of a Mo-containing metal such as pure Mo, a Mo—N alloy, a Mo—Nb alloy, a Mo—V alloy, a Mo—Ti alloy, and a Mo—W alloy having good contact characteristics with indium tin oxide ("ITO") and indium zinc oxide ("IZO"). It is preferable that the upper and the lower layers 171p, 171r, 175p, and 175r are made of a Mo—Nb alloy. In an alternative embodiment, the upper layer 171r, 175r as a capping metal may be omitted.

As shown in FIGS. 2 and 3, the lower layer, the middle layer, and the upper layer of the source electrode 173, the drain electrode 175, and the end portion 179 of the data line 171 are respectively denoted by adding "p", "q", and "r" to the reference numbers of the source electrode 173, the drain electrode 175, and the end portion 179 of the data line 171, respectively.

The lower layers 171p and 175p enhance the adhesiveness between the middle layers 171q and 175q and the underlayers such as the ohmic contact stripes and islands 161 and 165 to prevent the middle layers 171q and 175q of Cu from peeling and lifting. Furthermore, the lower layers 171p and 175p prevent the Cu of the middle layers 171q and 175q from diffusing into the lower layers such as the ohmic contacts 161 and 165 and the semiconductor stripes 151 by oxidation.

Also, the upper layers 171r and 175r prevent the middle layers 171q and 175q from being contaminated, corroded, or oxidized by the etchant in the manufacturing process, and the upper layers 171r and 175r prevent the Cu of the middle layers 171q and 175q from diffusing into other layers connected thereto.

The data lines 171 and the drain electrodes 175 have inclined edge profiles, and the inclination angles thereof are is a range of about 30 to about 80 degrees.

The ohmic contacts 161 and 165 are interposed only between the underlying semiconductor stripes 151 and the overlying conductors 171 and 175 thereon, and reduce the contact resistance there between. Although the semiconductor stripes 151 are narrower than the data lines 171 at most places, the width of the semiconductor stripes 151 becomes large near the gate lines 121 and the storage electrode lines 131 as described above, to smooth the profile of the surface, thereby preventing disconnection of the data lines 171. The semiconductor stripes 151 may have almost the same planar shapes as the data lines 171 and the drain electrodes 175 as well as the underlying ohmic contacts 161 and 165. However, the semiconductor stripes 151 include some exposed portions, which are not covered with the data lines 171 and the drain electrodes 175, such as portions of the projections 154 located between the source electrodes 173 and the drain electrodes 175.

A passivation layer 180 is formed on the data lines 171, the drain electrodes 175, and the exposed portions of the semiconductor stripes 151, as well as on exposed portions of the gate insulating layer 140. The passivation layer 180 is preferably made of an inorganic or organic insulator, and it may have a flat top surface. Examples of the inorganic insulator include silicon nitride and silicon oxide. The organic insulator may have photosensitivity and a dielectric constant of less than about 4.0, such as a-Si:C:O and a-Si:O:F formed by plasma enhanced chemical vapor deposition ("PECVD"). The passivation layer 180 may include a lower film of an inorganic insulator and an upper film of an organic insulator such that it takes the excellent insulating characteristics of the organic insulator while preventing the exposed portions of the semiconductor stripes 151 from being damaged by the organic insulator.

The passivation layer 180 has a plurality of contact holes 182 and 185 exposing the end portions 179 of the data lines 171 and the drain electrodes 175, respectively. The passivation layer 180 and the gate insulating layer 140 have a plurality of contact holes 181 exposing the end portions 129 of the gate lines 121, a plurality of contact holes 183a exposing portions of the storage electrode lines 131 near the fixed end portions of the storage electrodes 133a, and a plurality of contact holes 183b exposing the linear branches of the free end portions of the storage electrodes 133a.

A plurality of pixel electrodes 191, a plurality of overpasses 83, and a plurality of contact assistants 81 and 82 are formed on the passivation layer 180. They are preferably made of a transparent conductor such as ITO or IZO, or a reflective conductor such as silver Ag, aluminum Al, chromium Cr, and alloys thereof.

The pixel electrodes 191 are physically and electrically connected to the drain electrodes 175 through the contact holes 185 such that the pixel electrodes 191 receive data voltages from the drain electrodes 175. The pixel electrodes 191 supplied with the data voltages generate electric fields in cooperation with a common electrode of an opposing color filter panel (not shown) supplied with a common voltage, which determine the orientations of liquid crystal molecules (not shown) of a liquid crystal layer (not shown) disposed between the TFT array panel 100 and the color filter panel. A pixel electrode 191 and the common electrode form a capacitor referred to as a "liquid crystal capacitor," which stores applied voltages after the TFT turns off.

A pixel electrode 191 overlaps a storage electrode line 131 including storage electrodes 133a and 133b. The pixel electrode 191 and a drain electrode 175 connected thereto and the storage electrode line 131 form an additional capacitor referred to as a "storage capacitor," which enhances the voltage storing capacity of the liquid crystal capacitor.

The overpasses 83 cross over the gate lines 121, and they are connected to the exposed portions of the storage electrode lines 131 and the exposed linear branches of the free end portions of the storage electrodes 133b through the contact holes 183a and 183b, respectively, which are disposed opposite each other with respect to the gate lines 121. The storage electrode lines 131 including the storage electrodes 133a and 133b along with the overpasses 83 can be used for repairing defects in the gate lines 121, the data lines 171, or the TFTs.

The contact assistants 81 and 82 are connected to the end portions 129 of the gate lines 121, and the end portions 179 of the data lines 171 through the contact holes 181 and 182 respectively. The contact assistants 81 and 82 protect the end portions 129, and 179, and enhance the adhesion between the end portions 129 and 179 and external devices.

Now, an exemplary method of manufacturing the exemplary TFT array panel shown in FIGS. 1 to 3 according to an exemplary embodiment of the present invention will be described with reference to FIGS. 4 to 15.

Figure 4:
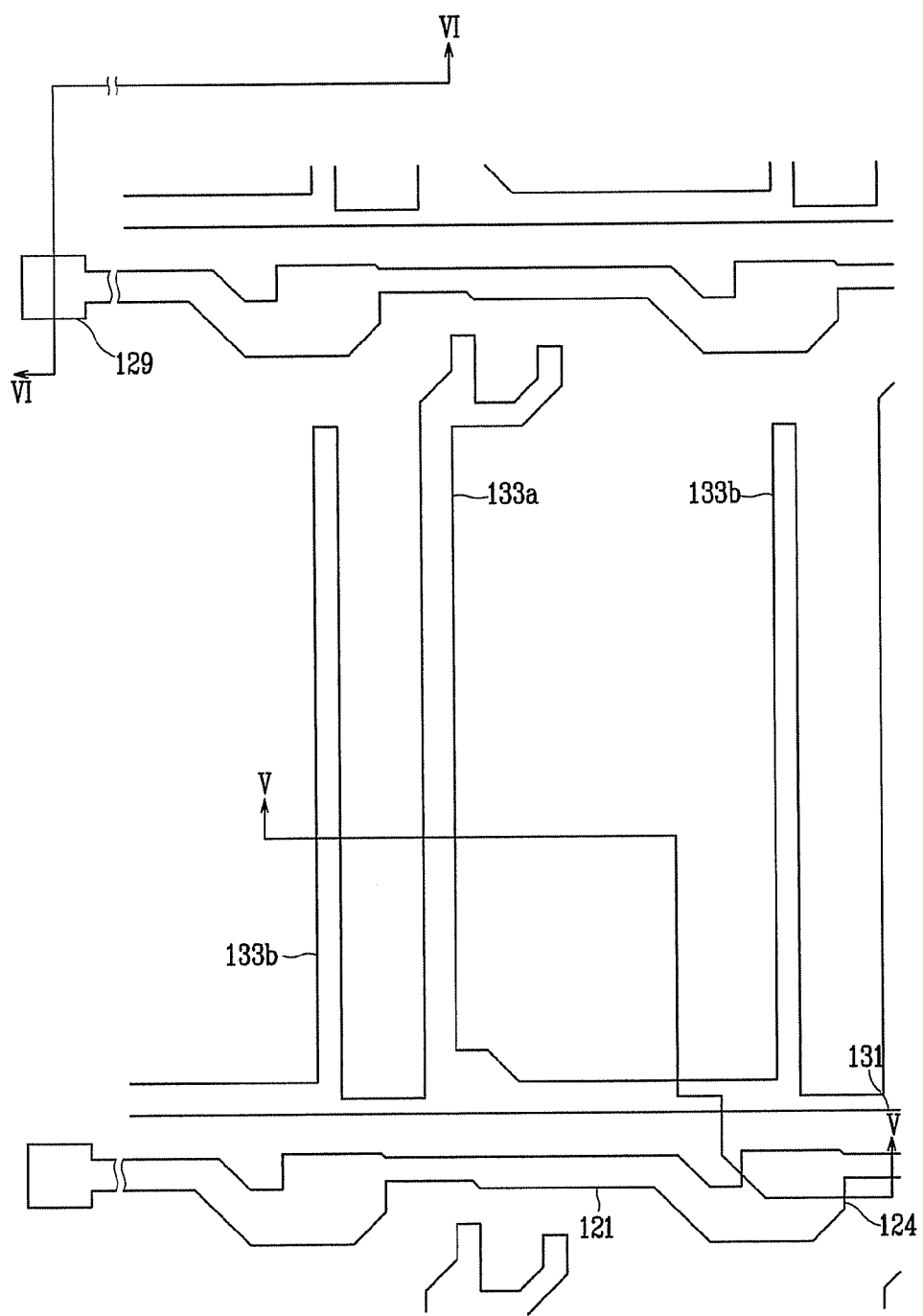
FIGS. 4, 7, 10, and 13 are layout views of the exemplary TFT array panel shown in FIGS. 1, 2, and 3 in intermediate steps of an exemplary manufacturing method thereof according to an exemplary embodiment of the present invention.
Figure 5:
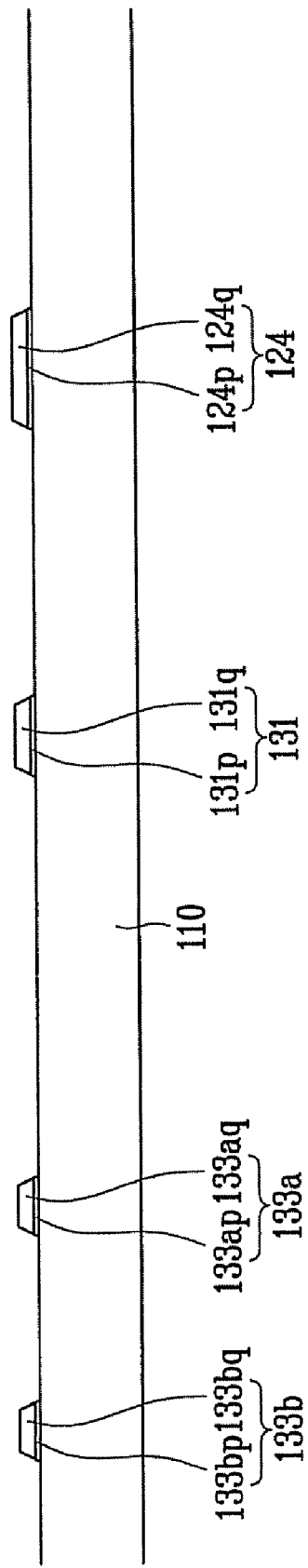
FIGS. 5 and 6 are sectional views of the exemplary TFT array panel shown in FIG. 4 taken along lines V-V and VI-VI.
Figure 6:
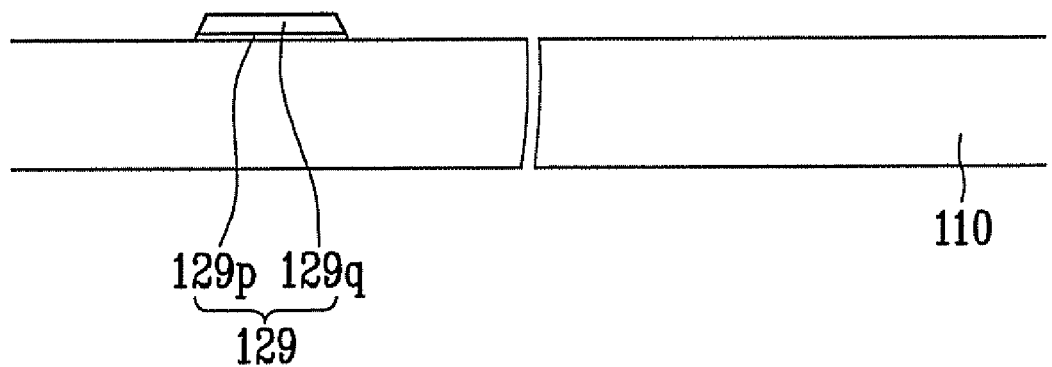
Figure 7:
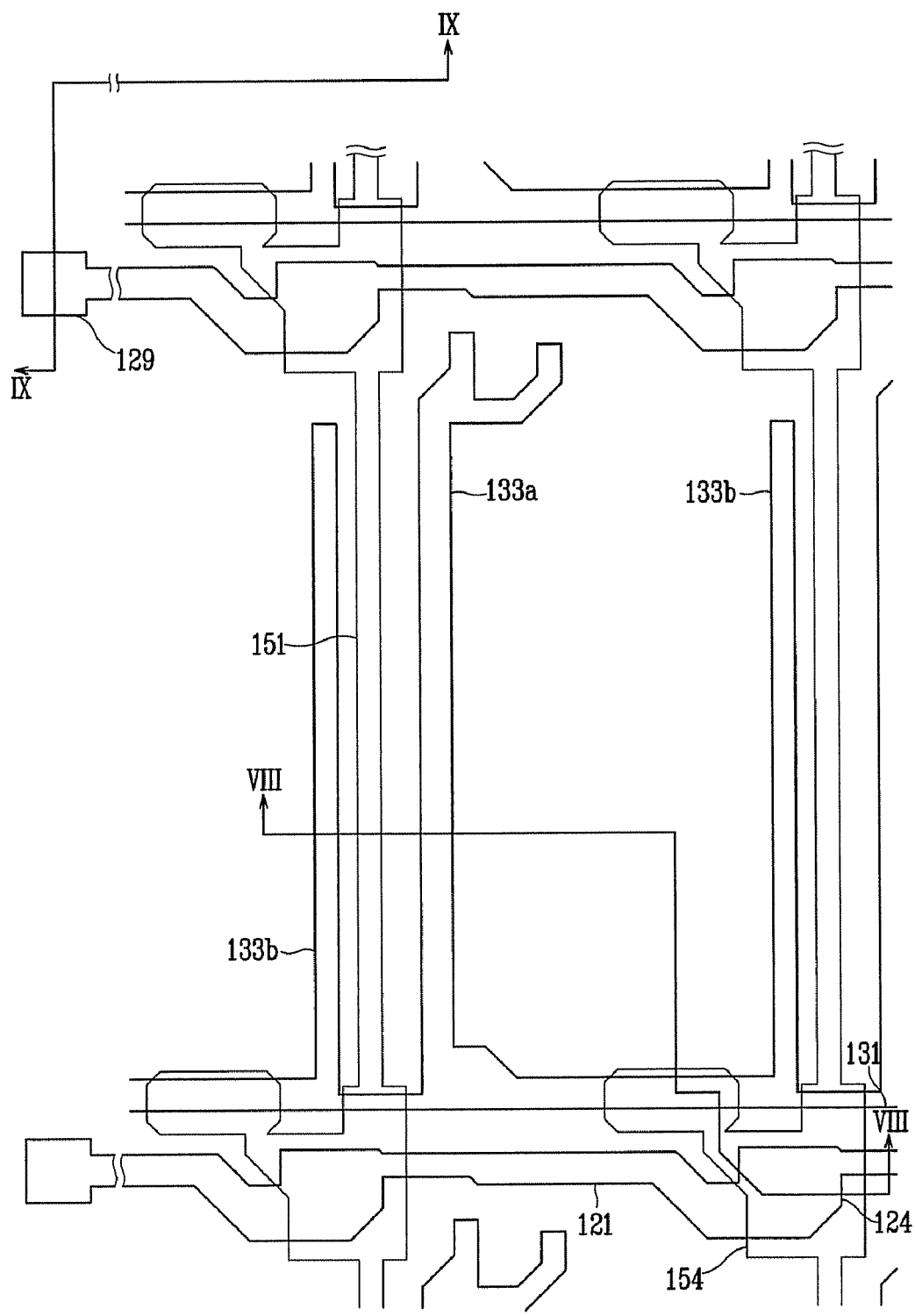
Figure 8:
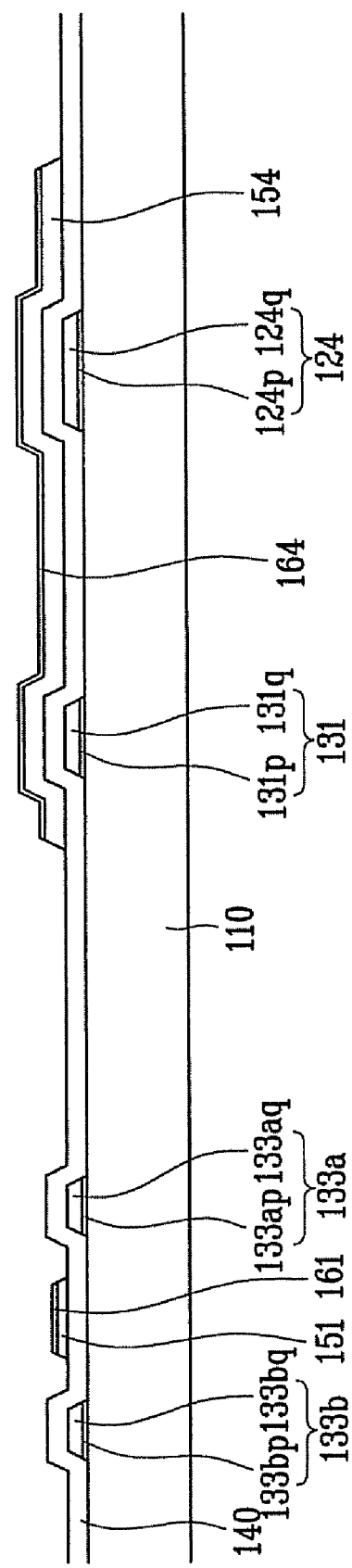
FIGS. 8 and 9 are sectional views of the exemplary TFT array panel shown in FIG. 7 taken along lines VIII-VIII and IX-IX.
Figure 9:
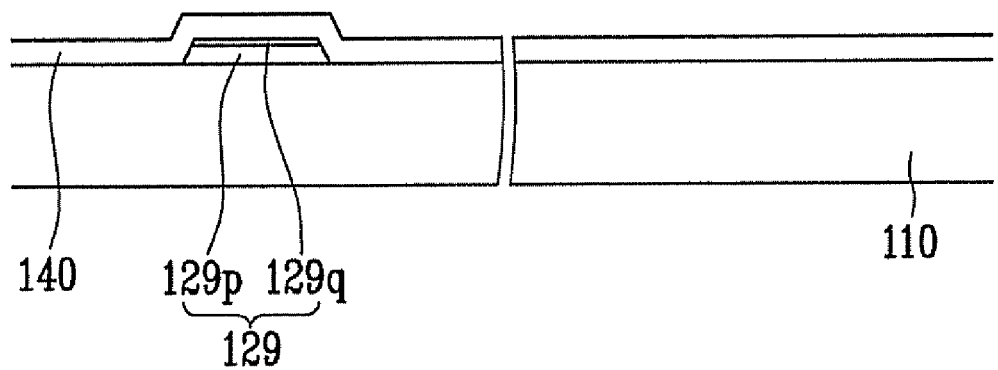
Figure 10:
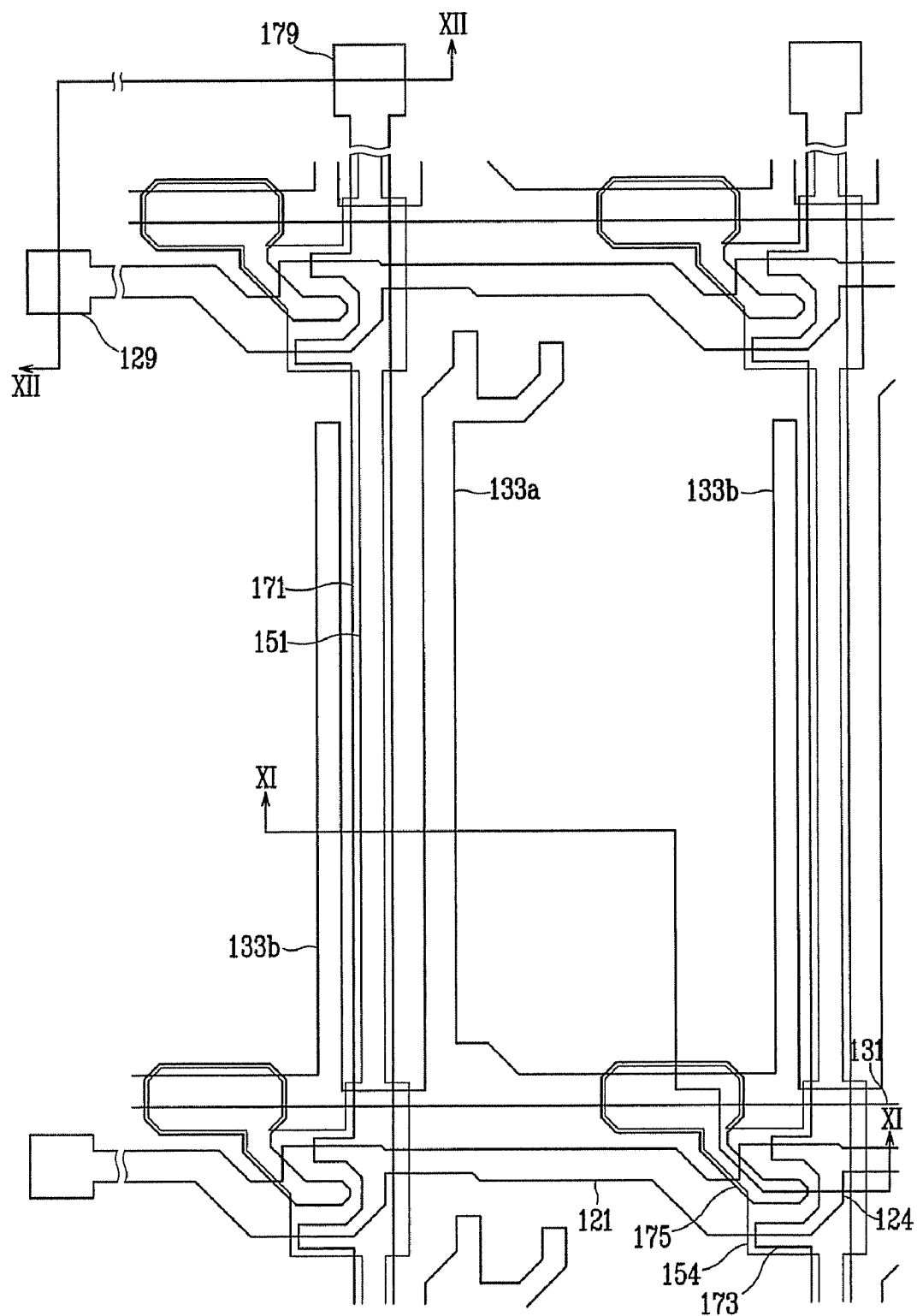
Figure 11:
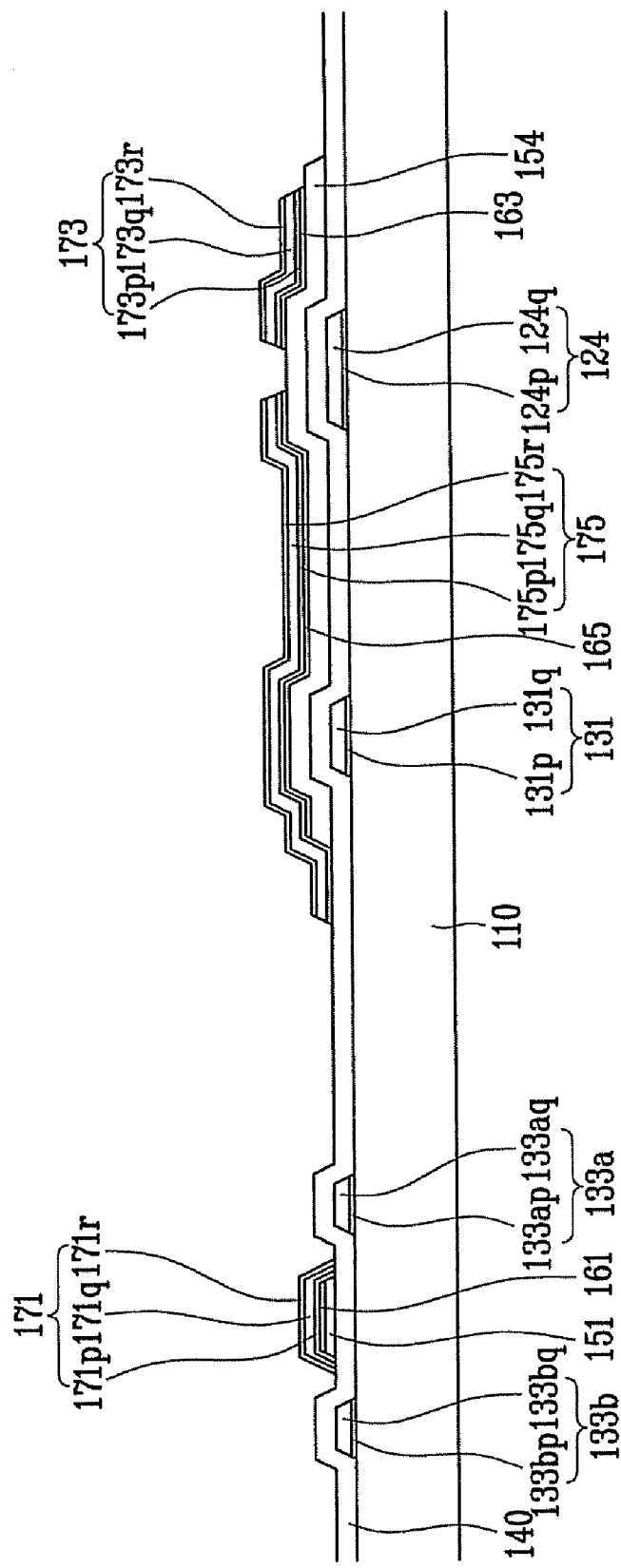
FIGS. 11 and 12 are sectional views of the exemplary TFT array panel shown in FIG. 10 taken along lines XI-XI and XII-XII.
Figure 12:
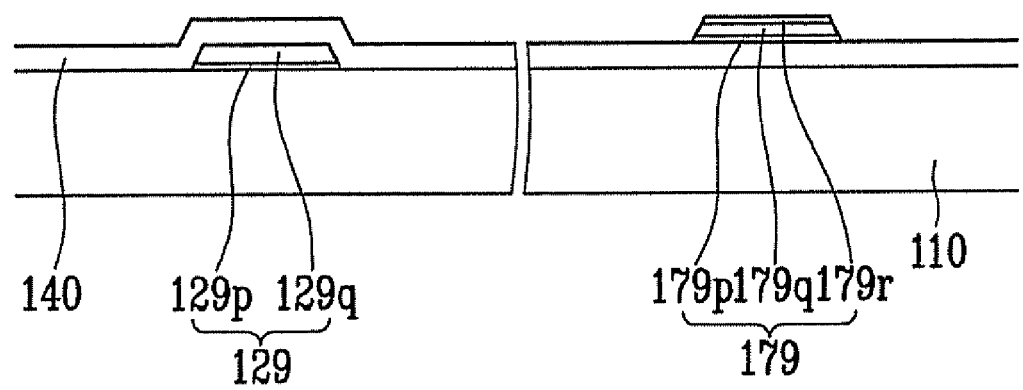
Figure 13:
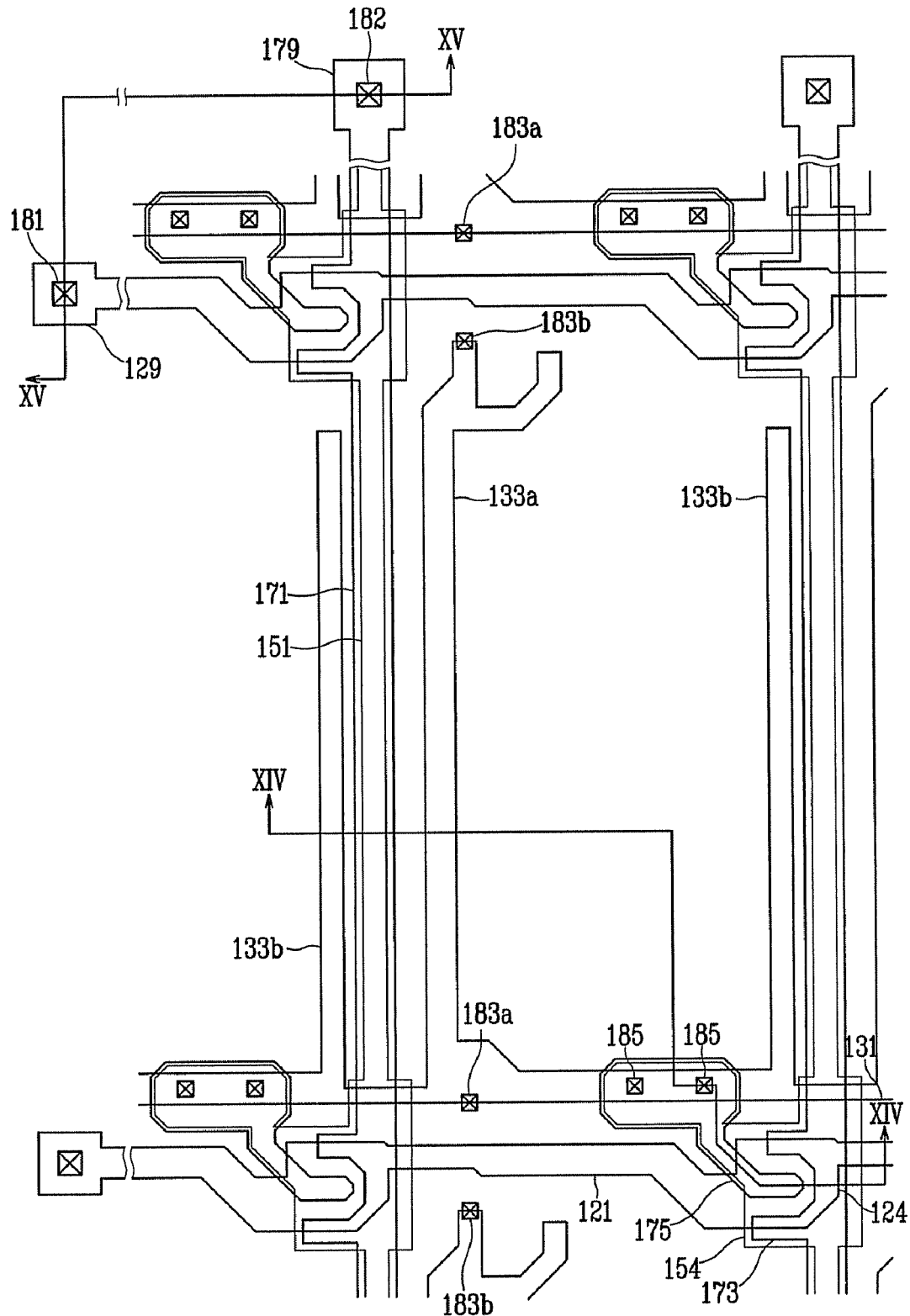
Figure 14:
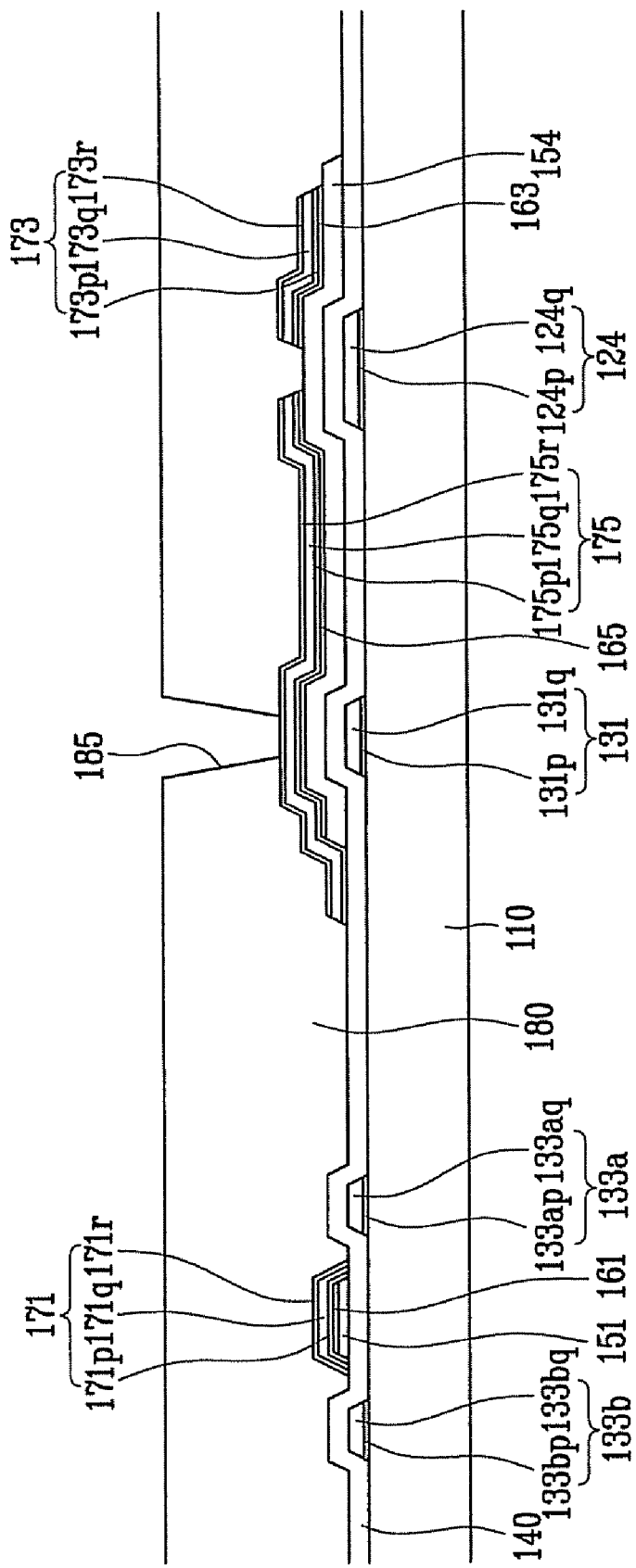
FIGS. 14 and 15 are sectional views of the exemplary TFT array panel shown in FIG. 13 taken along lines XIV-XIV and XV-XV.
Figure 15:
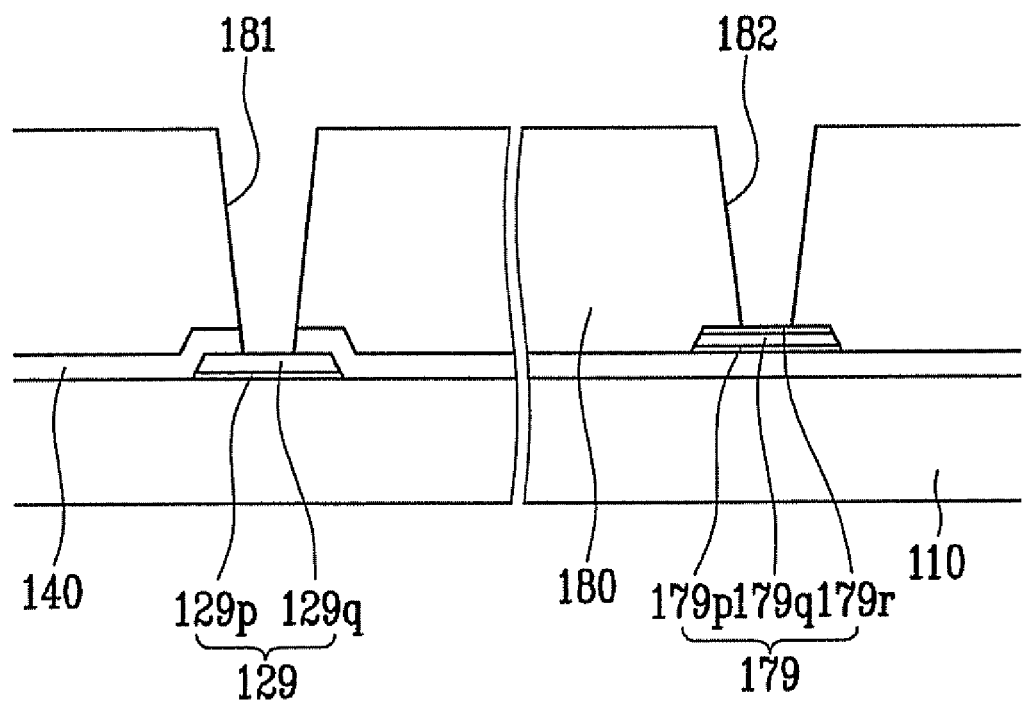

FIGS. 4, 7, 10, and 13 are layout views of the exemplary TFT array panel shown in FIGS. 1, 2, and 3 in intermediate steps of an exemplary manufacturing method thereof according to an exemplary embodiment of the present invention, FIGS. 5 and 6 are sectional views of the exemplary TFT array panel shown in FIG. 4 taken along lines V-V and VI-VI, FIGS. 8 and 9 are sectional views of the exemplary TFT array panel shown in FIG. 7 taken along lines VIII-VIII and IX-IX, FIGS. 11 and 12 are sectional views of the exemplary TFT array panel shown in FIG. 10 taken along lines XI-XI and XII-XII, and FIGS. 14 and 15 are sectional views of the exemplary TFT array panel shown in FIG. 13 taken along lines XIV-XIV and XV-XV.

As shown in FIGS. 4 to 6, two metal films including a lower film made of Mo—Nb alloy and an upper film made of a Cu-containing metal are sequentially sputtered on an insulating substrate 110 made of a material such as, but not limited to, transparent glass or plastic, and are sequentially patterned by wet etching with a photoresist pattern to form a plurality of gate lines 121 including a plurality of gate electrodes 124 and an end portion 129, and a plurality of storage electrodes 131 having a pair of storage electrodes 133a and 133b.

It is preferably that the thickness of the lower layer 124p, 129p, 131p, 133ap, 133bp is in the range of 50 to 500 angstroms, more particularly 100 to 300 angstroms, and that the upper layer 124q, 129q, 131q, 133aq, 133bq is in the range of 1000 to 3000 angstroms, more particularly 1500 to 2500 angstroms.

Also, the lower layers 124p, 129p, 131p, 133ap, and 133bp and the upper layers 124q, 129q, 131q, 133aq, and 133bq may be patterned by one etch condition using an etchant, and the etchant may include benzotriazole, citric acid, hydrogen peroxide, hydrofluoric acid, and deionized water. It is preferable that the etchant includes benzotriazole at about 0.1 to 1 wt %, citric acid at about 1 to 5 wt %, hydrogen peroxide at about 10 to 20 wt %, hydrofluoric acid at about 0.01 to 0.5 wt %, and deionized water for the remainder, and the etchant may include additives such as surfactants.

As shown in FIGS. 7 to 9, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is deposited with a thickness of about 2000 Å to about 5000 Å in a temperature range of 250 to 500° C.

As shown in FIGS. 10 to 12, three metal layers including a lower layer made of Mo—Nb alloy, a middle layer made of a Cu-containing metal, and an upper layer made of a Mo—Nb alloy are sequentially sputtered on the gate insulating layer 140 and on the extrinsic semiconductor stripes 164 and the intrinsic semiconductor stripes 151, and are sequentially patterned by wet etching using one etch condition with a photoresist pattern to form a plurality of data lines 171 each including a plurality of source electrodes 173 and an end portion 179, and a plurality of drain electrodes 175, which includes the three metal layers 171p, 171q, 171r, 175p, 175q, and 175r. It is preferable that an etchant of the etch condition is the same or substantially the same as that for etching the gate lines 121 and the storage electrode lines 131.

Portions of the extrinsic semiconductor stripes 164 formed from the extrinsic a-Si layer that are not covered with the data lines 171 and the drain electrodes 175 are removed by etching to complete a plurality of ohmic contact stripes 161 including a plurality of projections 163 and a plurality of ohmic contact islands 165, and to expose portions of the projections 154 of the intrinsic semiconductor stripes 151. Oxygen plasma treatment may follow thereafter in order to stabilize the exposed surfaces of the semiconductor stripes 151.

As shown in FIGS. 13 to 15, a passivation layer 180 preferably made of an inorganic insulating material such as silicon nitride or an organic insulating material with photosensitivity or flatness is deposited on the data lines 171, the drain electrodes 175, and the exposed portions of the semiconductor stripes 151, as well as on the exposed portions of the gate insulating layer 140.

Thereafter, the passivation layer 180 and the gate insulating layer 140 are photo-etched to form a plurality of contact holes 181, 182, and 185 exposing the drain electrodes 175, and the end portions 129 and 179 of the gate lines 121 and the data lines 171, a plurality of contact holes 183a exposing portions of the storage electrode lines 131 near the fixed end portions of the storage electrodes 133a, and a plurality of contact holes 183b exposing the linear branches of the free end portions of the storage electrodes 133a.

Finally, with reference again to FIGS. 1 to 3, a transparent material such as ITO is sputtered and etched to form a plurality of pixel electrodes 191, a plurality of contact assistants 81 and 82, and a plurality of overpasses 83 on the passivation layer 180.

A TFT array panel according to another exemplary embodiment of the present invention will be described in detail with reference to FIGS. 16 to 33.

Figure 16:
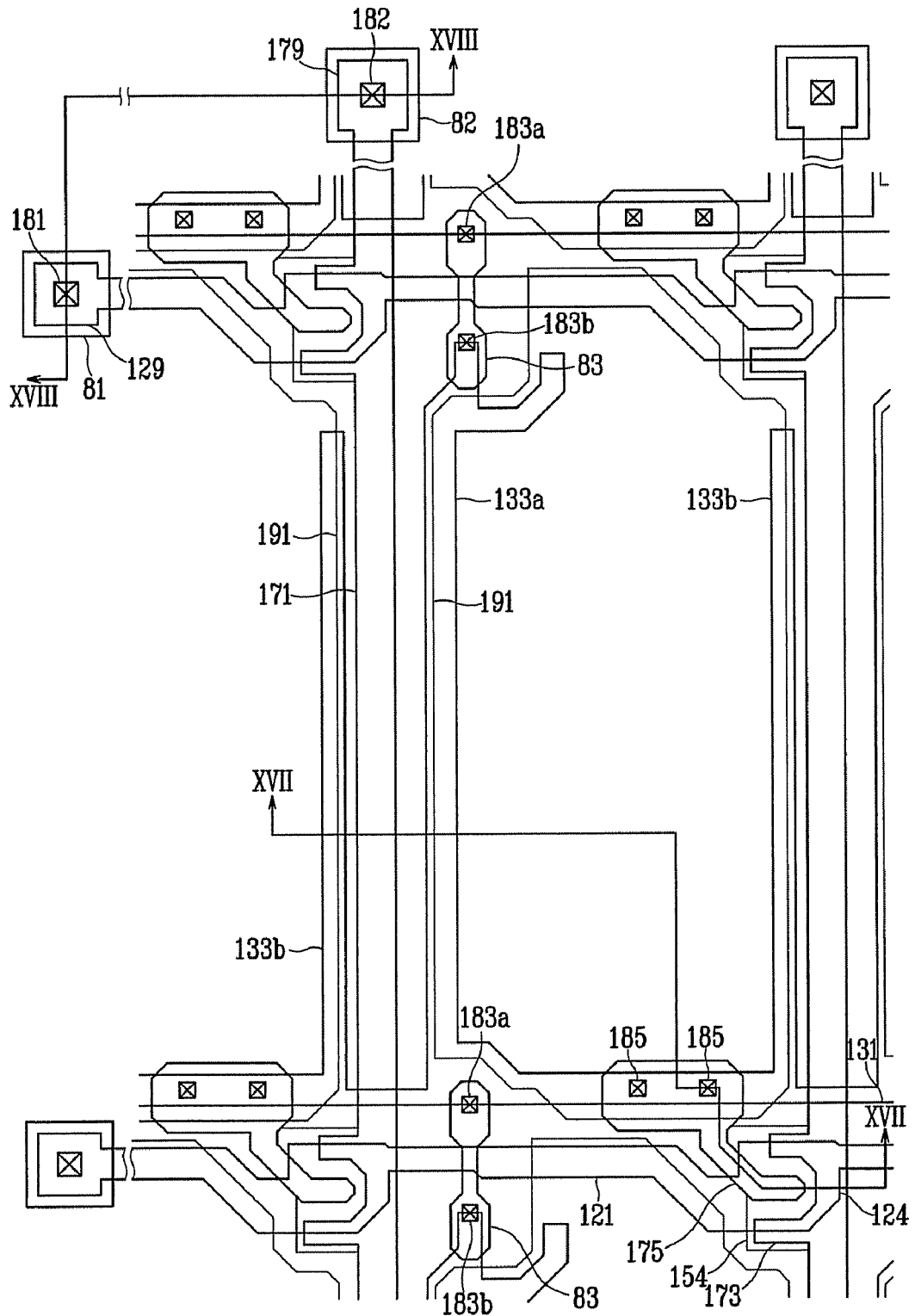
FIG. 16 is an exemplary layout view of an exemplary TFT array panel for an exemplary LCD according to another exemplary embodiment of the present invention.
Figure 17:
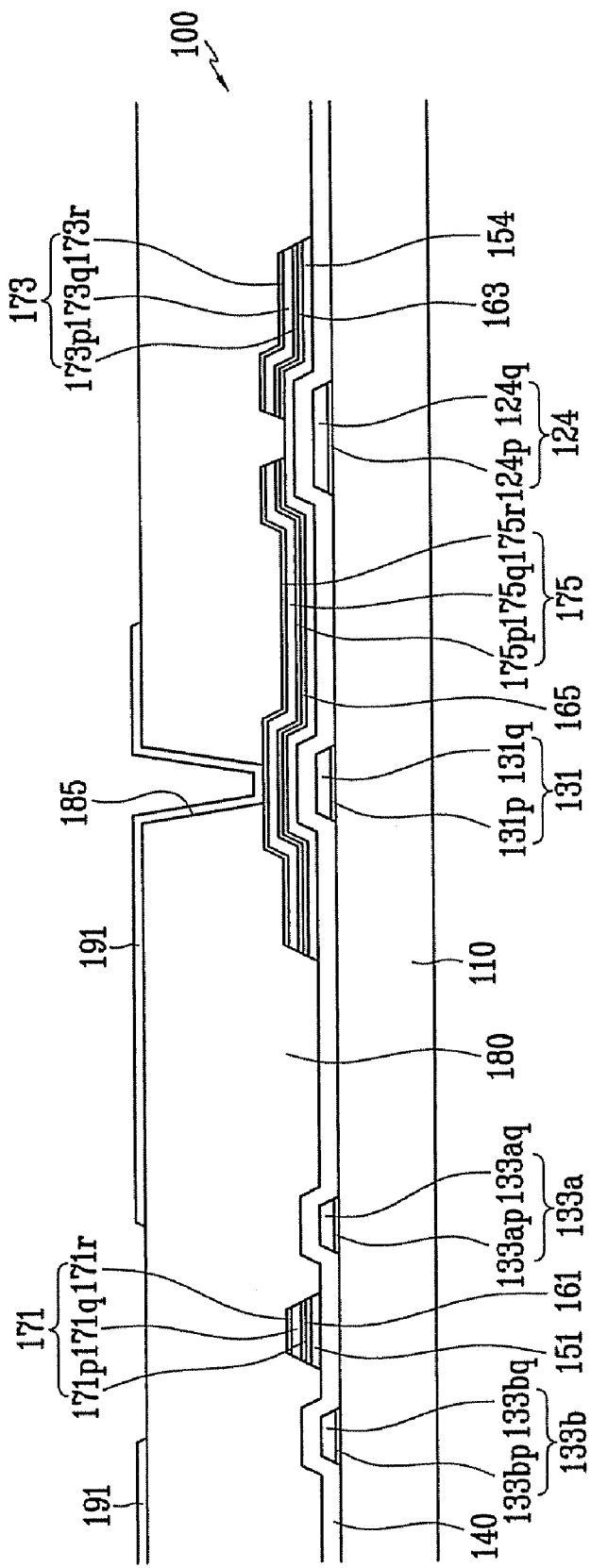
FIGS. 17 and 18 are sectional views of the exemplary TFT array panel shown in FIG. 16, taken along lines XVII-XVII and XVIII-XVIII, respectively.
Figure 18:
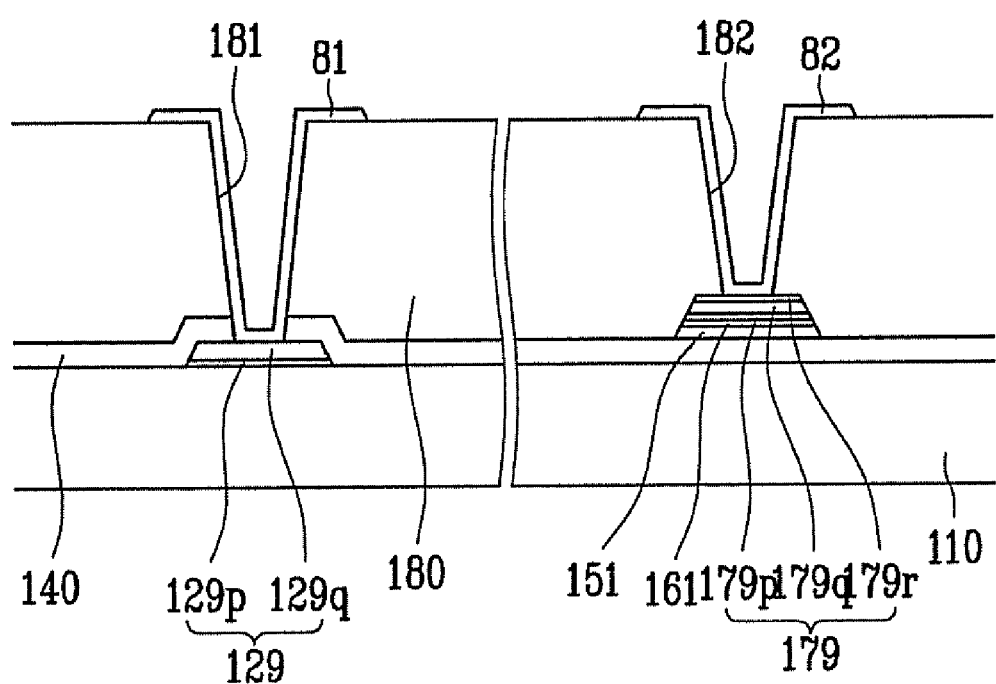

FIG. 16 is an exemplary layout view of an exemplary TFT array panel for an exemplary LCD according to another exemplary embodiment of the present invention, and FIGS. 17 and 18 are sectional views of the exemplary TFT array panel shown in FIG. 16, taken along lines XVII-XVII and XVIII-XVIII, respectively.

Referring to FIGS. 16 to 18, layered structures of the exemplary TFT panels according to this exemplary embodiment are almost the same as those shown in FIGS. 1 to 3.

A plurality of gate lines 121 including gate electrodes 124 and end portions 129 and a plurality of storage electrode lines 131 including storage electrodes 133a and 133b are formed on a substrate 110, and a gate insulating layer 140, a plurality of semiconductor stripes 151 including projections 154, and a plurality of ohmic contact stripes 161 including projections 163 and a plurality of ohmic contact islands 165 are sequentially formed thereon. A plurality of data lines 171 including source electrodes 173 and end portions 179, and a plurality of drain electrodes 175 are formed on the ohmic contacts 161 and 165 and on the gate insulating layer 140, and a passivation layer 180 is formed thereon. A plurality of contact holes 181, 182, 183a, 183b, and 185 are provided at the passivation layer 180 and/or the gate insulating layer 140. A plurality of pixel electrodes 190, a plurality of contact assistants 81 and 82, and a plurality of overpasses 83 are formed on the passivation layer 180.

Different from the LCD shown in FIGS. 1 to 3, the semiconductor stripes 151 except for the projections 154 have almost the same planar shapes as the data lines 171 and the drain electrodes 175 as well as the underlying ohmic contacts 161 and 165. However, the semiconductor stripes 151 include some exposed portions, which are not covered with the data lines 171 and the drain electrodes 175, such as portions located between the source electrodes 173 and the drain electrodes 175.

An exemplary method of manufacturing the exemplary TFT array panel shown in FIGS. 16 to 18 according to an exemplary embodiment of the present invention is next described in detail with reference to FIGS. 19 to 33, as well as with reference to FIGS. 16 to 18.

Figure 19:
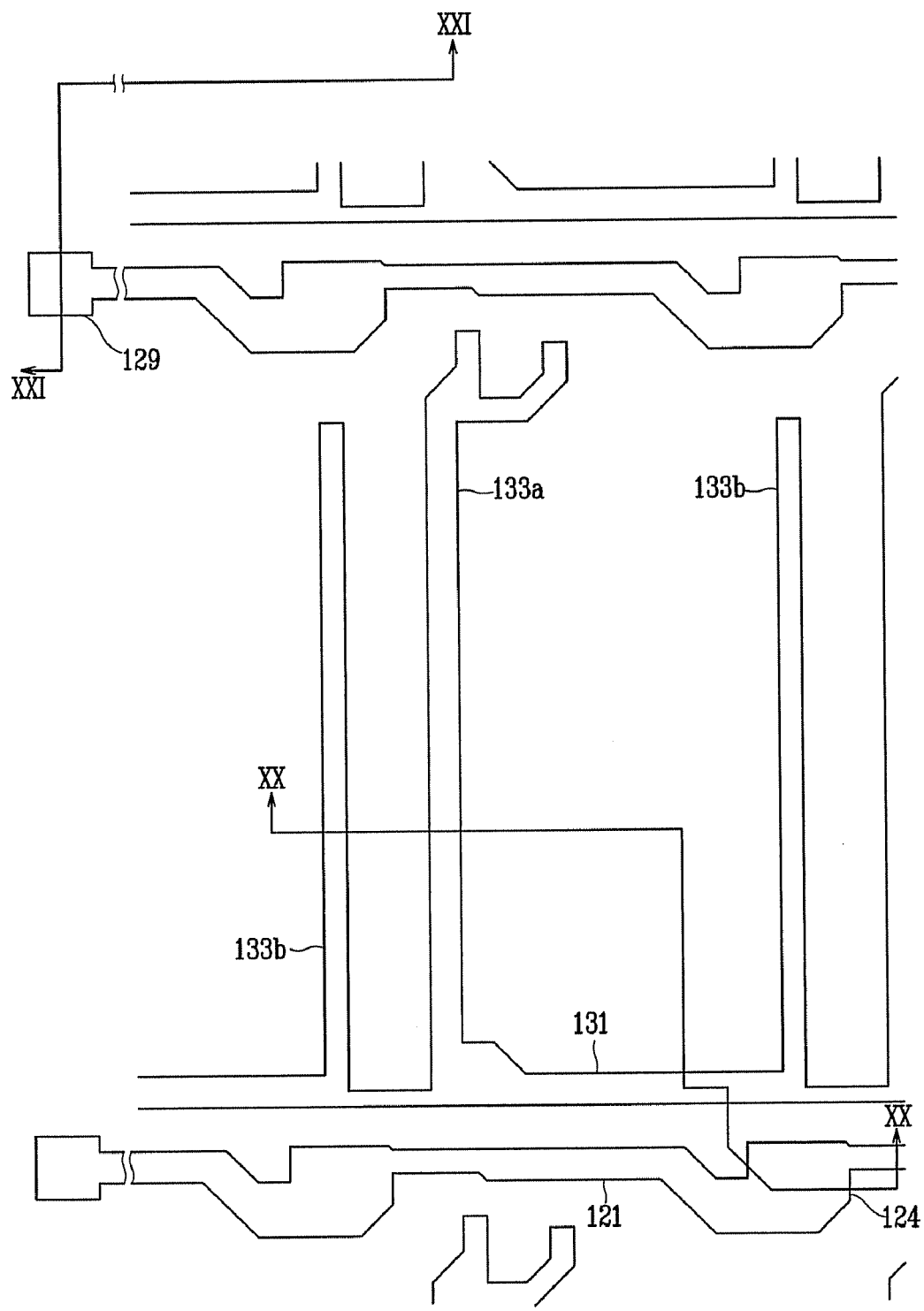
FIGS. 19, 28, and 31 are layout views of the exemplary TFT array panel shown in FIGS. 16, 17, and 18 in intermediate steps of an exemplary manufacturing method thereof according to an exemplary embodiment of the present invention.
Figure 20:
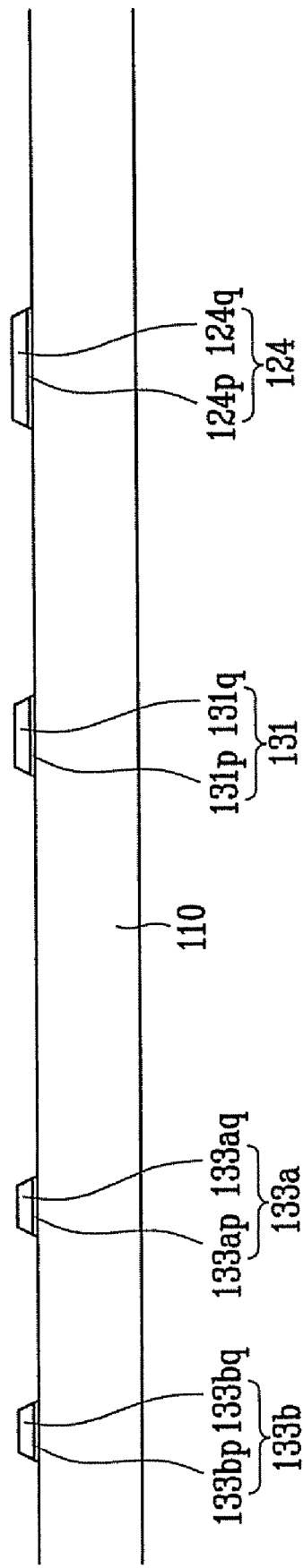
FIGS. 20 and 21 are sectional views of the exemplary TFT array panel shown in FIG. 19 taken along lines XX-XX and XXI-XXI.
Figure 21:
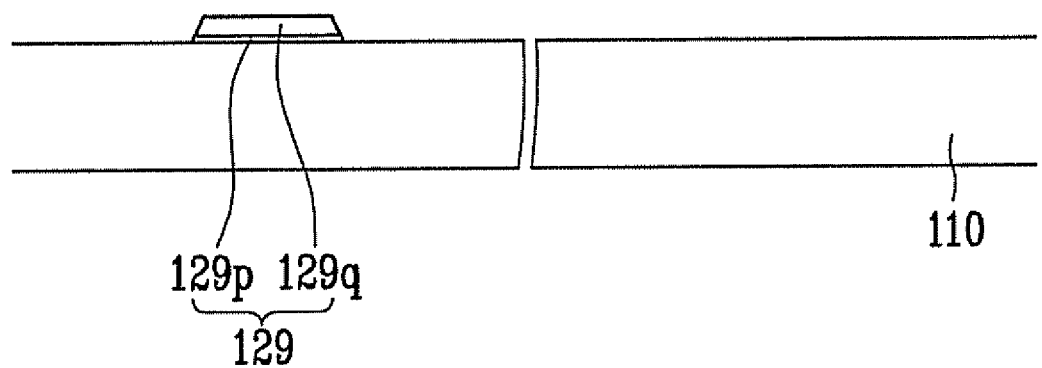
Figure 26:
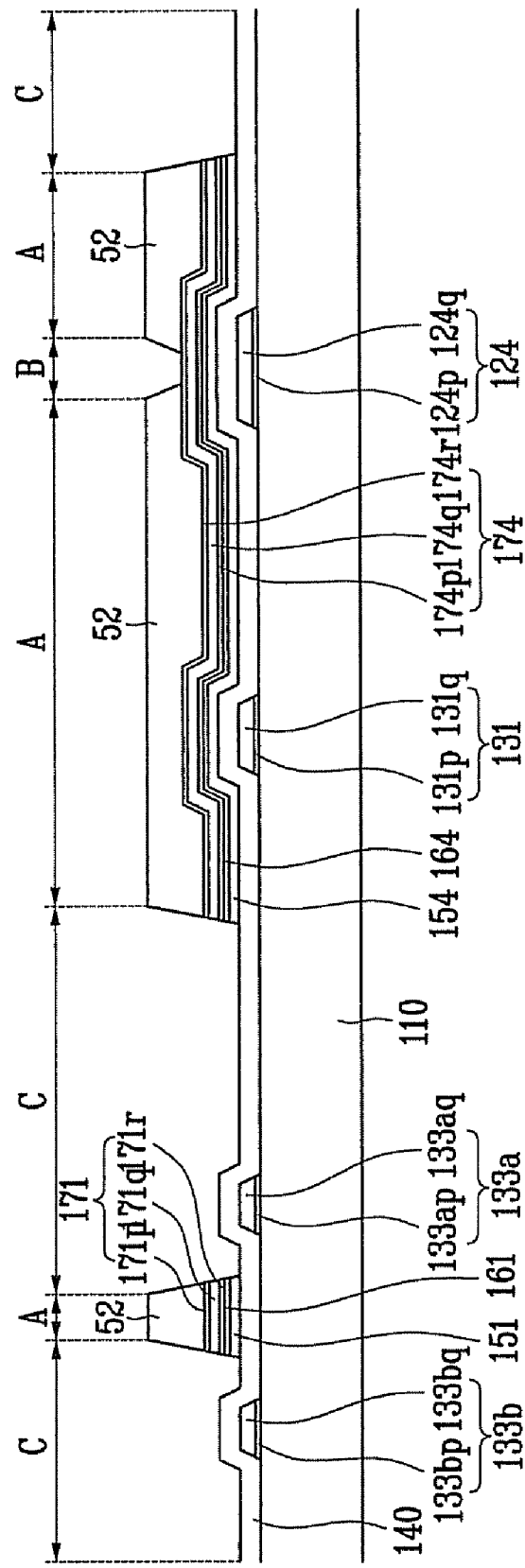
Figure 27:
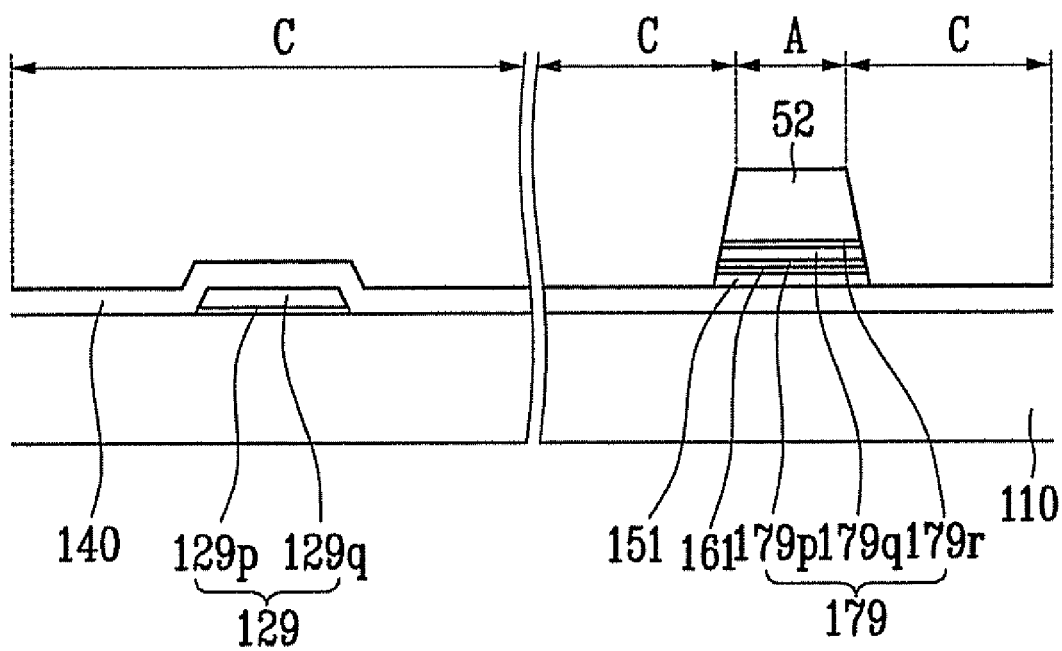
Figure 28:
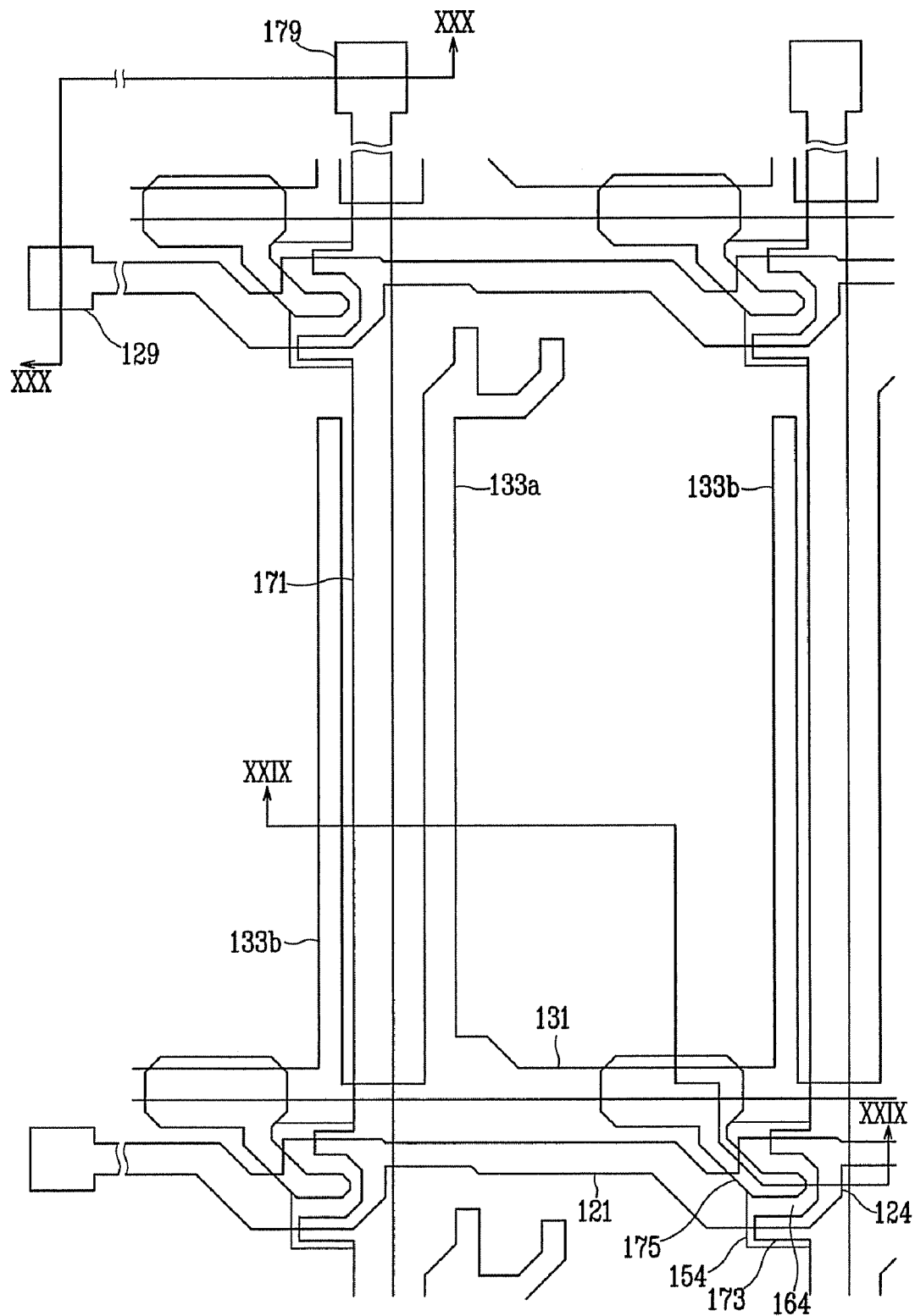
Figure 29:
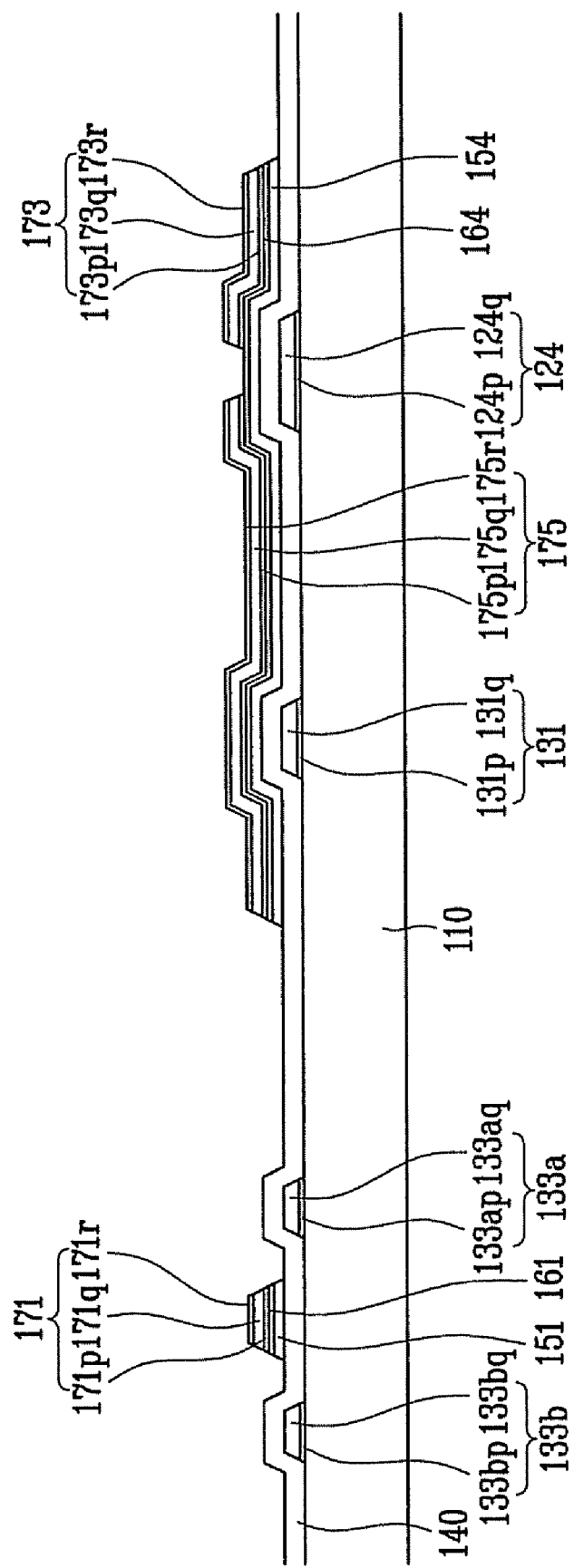
FIGS. 29 and 30 are sectional views of the exemplary TFT array panel shown in FIG. 28 taken along lines XXIX-XXIX and XXX-XXX.
Figure 30:
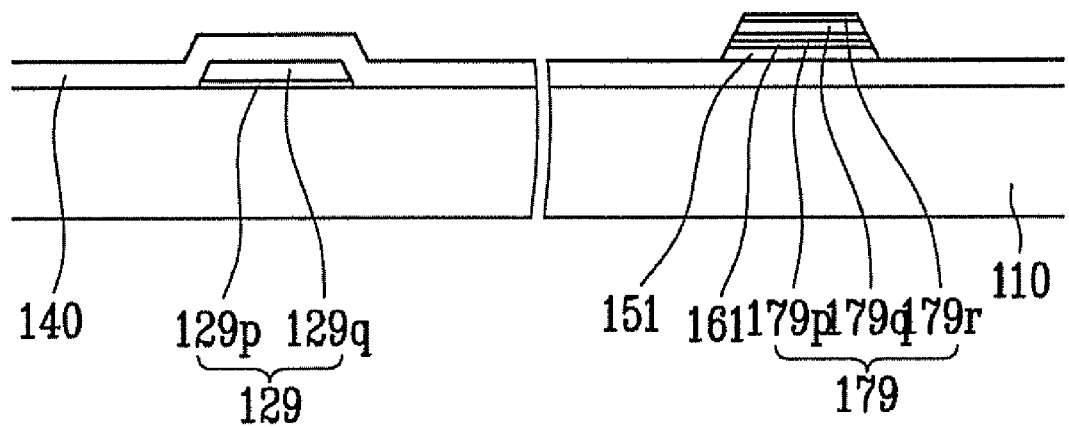
Figure 31:
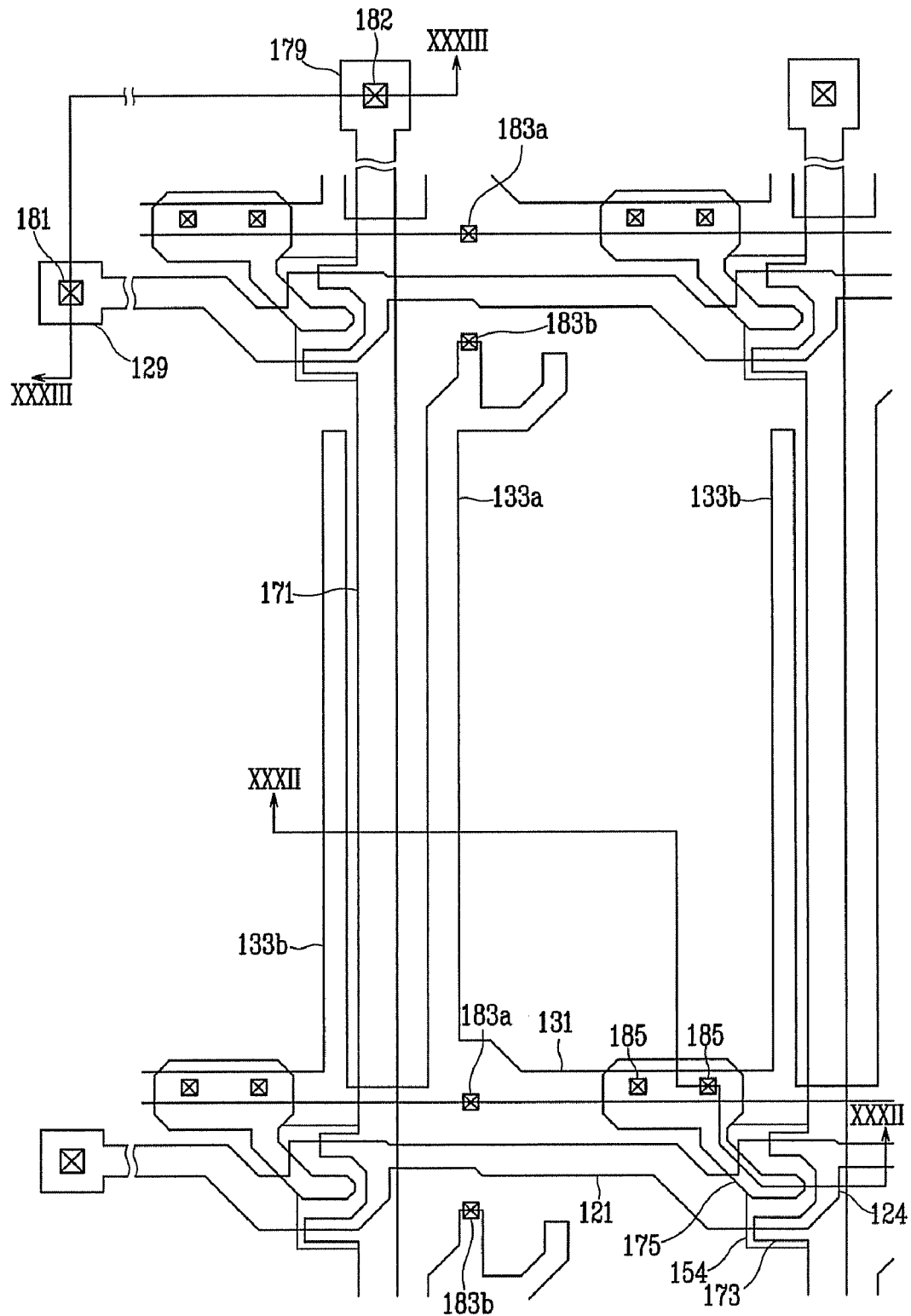
Figure 32:
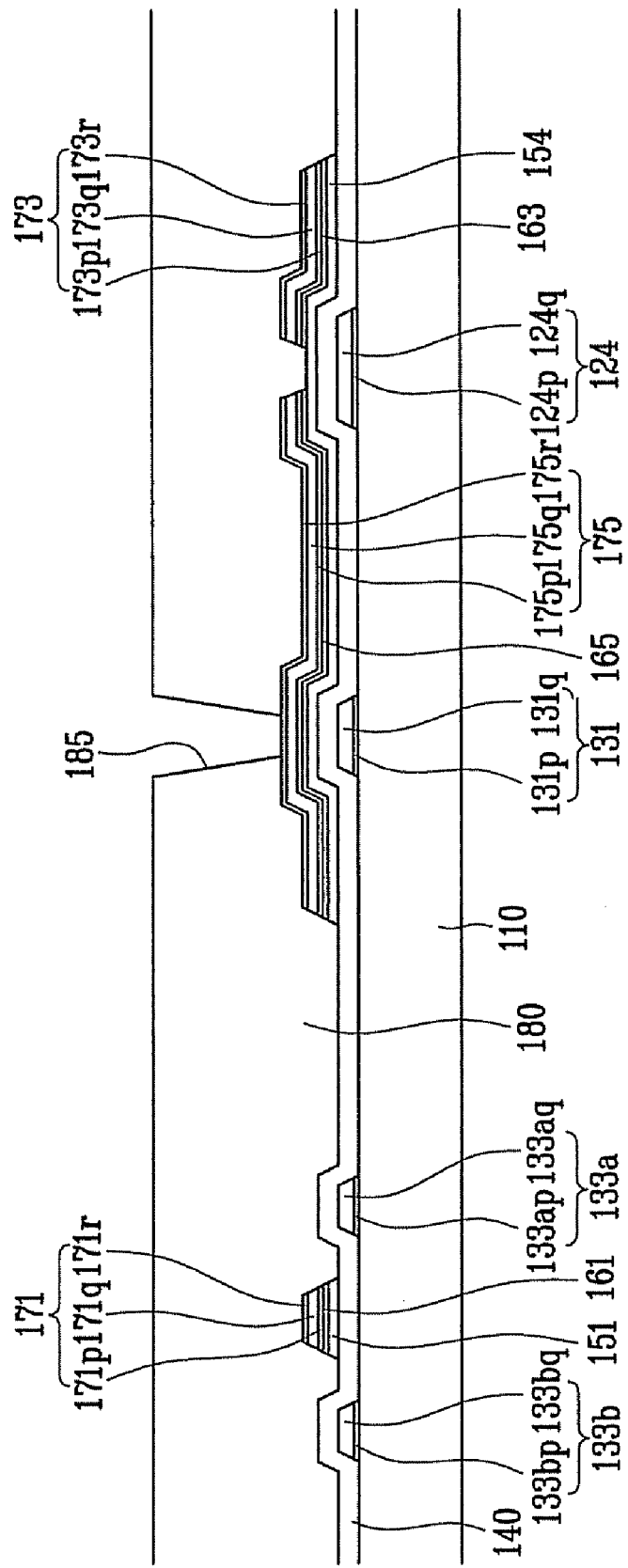
FIGS. 32 and 33 are sectional views of the exemplary TFT array panel shown in FIG. 31 taken along lines XXXII-XXXII and XXXIII-XXXIII.
Figure 33:
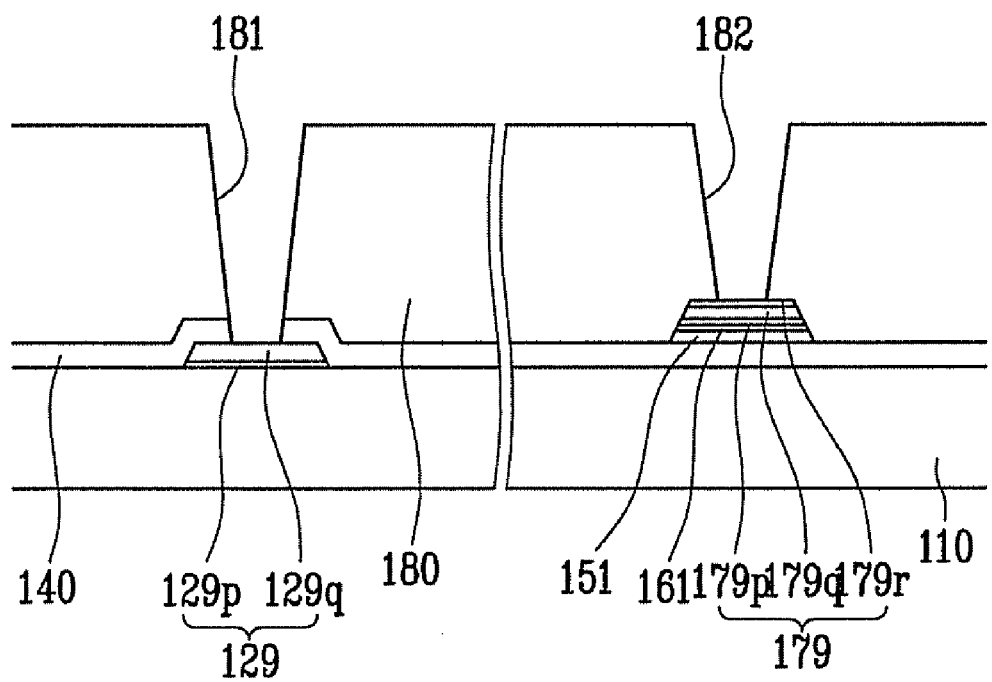

FIGS. 19, 28, and 31 are layout views of an exemplary TFT array panel shown in FIGS. 16, 17, and 18 in intermediate steps of an exemplary manufacturing method thereof according to an exemplary embodiment of the present invention, FIGS. 20 and 21 are sectional views of the exemplary TFT array panel shown in FIG. 19 taken along lines XX-XX and XXI-XXI, FIGS. 22 to 27 are sectional views of the exemplary TFT array panel in intermediate steps of an exemplary manufacturing method thereof according to an exemplary embodiment of the present invention, FIGS. 29 and 30 are sectional views of the exemplary TFT array panel shown in FIG. 28 taken along lines XXIX-XXIX and XXX-XXX, and FIGS. 32 and 33 are sectional views of the exemplary TFT array panel shown in FIG. 31 taken along lines XXXII-XXXII and XXXIII-XXXIII.

As shown in FIGS. 19 to 21, two conductive films including a lower conductive film made of a Mo—Nb alloy and an upper conductive film made of made of a Cu-containing metal are sputtered in sequence on an insulating substrate 110 made of a material such as transparent glass. Next, the upper conductive film and the lower conductive film are wet-etched in sequence using a patterned photoresist film as an etch mask to form a plurality of gate lines 121 including a plurality of gate electrodes 124 and a plurality of end portions 129, and a plurality of storage electrode lines 131 including a plurality of storage electrodes 133a and 133b. Thereafter, the photoresist etch mask is removed.

Figure 22:
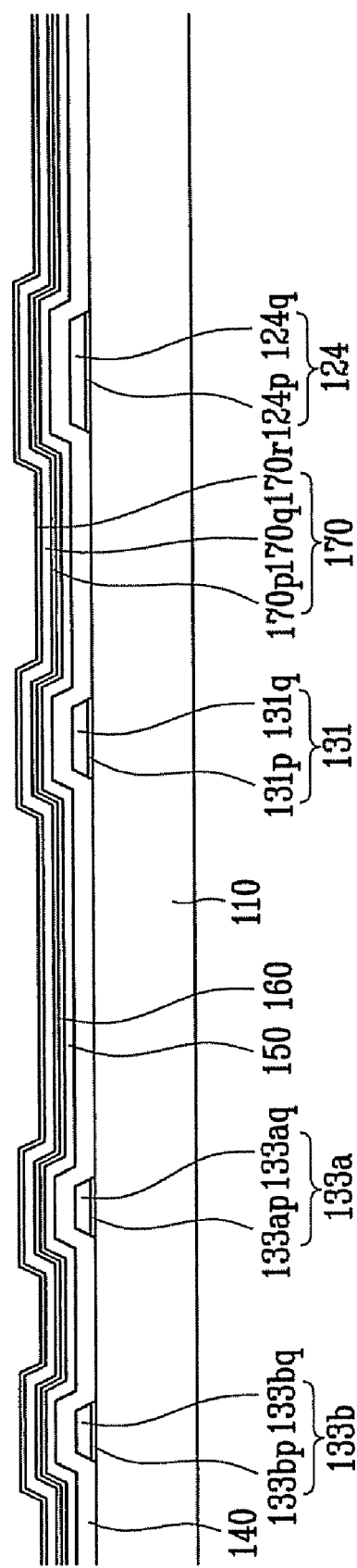
FIGS. 22 to 27 are sectional views of the exemplary TFT array panel in intermediate steps of an exemplary manufacturing method thereof according to an exemplary embodiment of the present invention.
Figure 23:
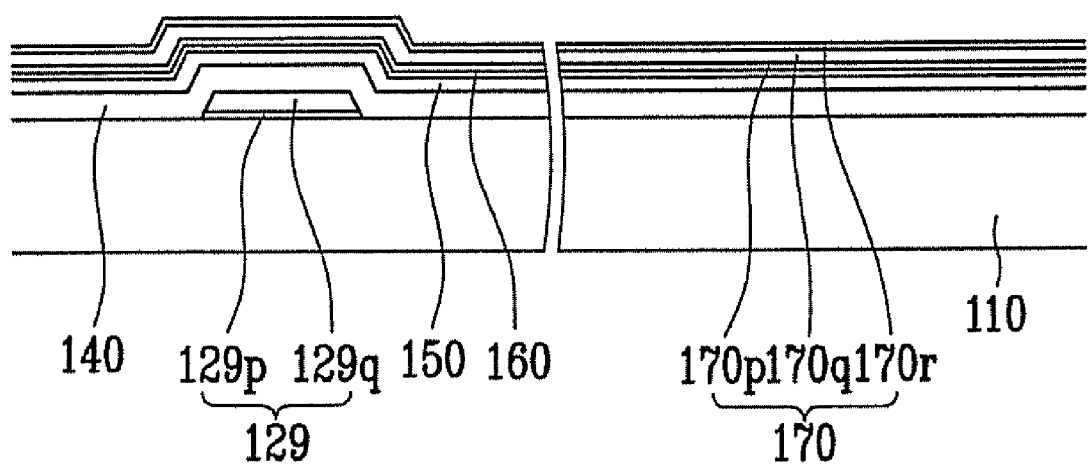

Referring to FIGS. 22 and 23, a gate insulating layer 140, an intrinsic a-Si layer 150, and an extrinsic a-Si layer 160 are sequentially deposited by chemical vapor deposition ("CVD").

A conductive layer 170 including a lower conductive layer 170p made of a Mo—Nb alloy, a middle conductive layer 170q made of a Cu-containing metal, and an upper layer 170r made of Mo—Nb alloy is then deposited by sputtering.

Figure 24:
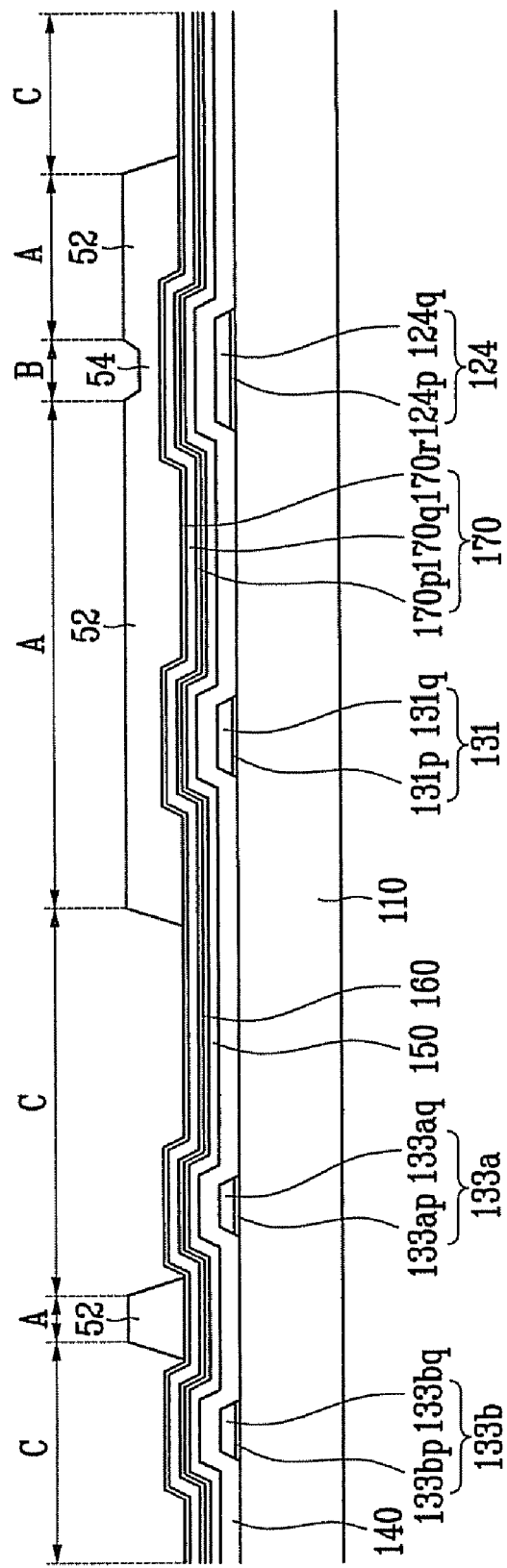
Figure 25:
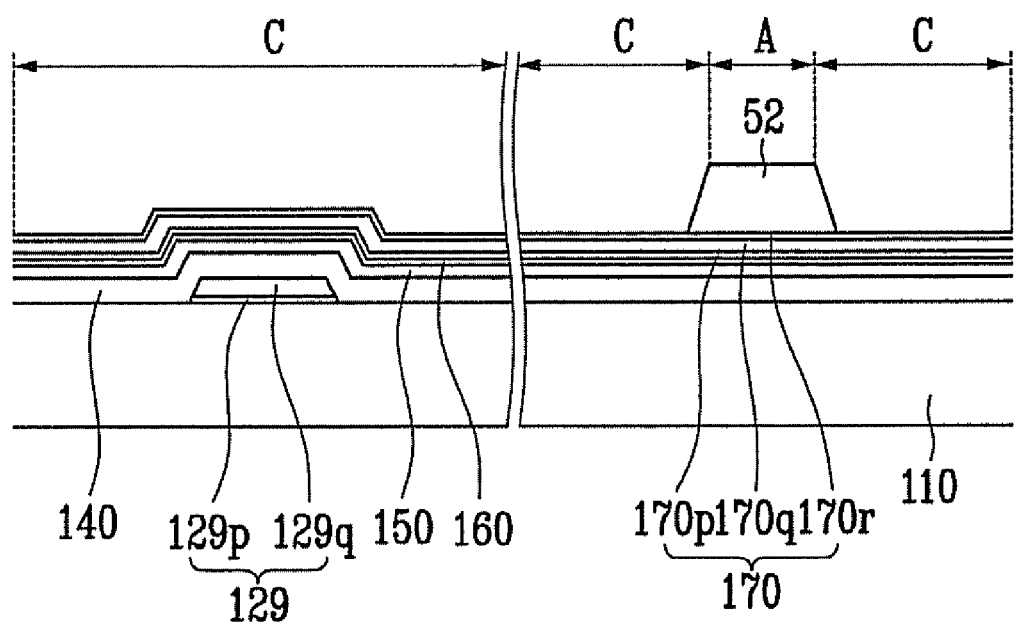

Referring to FIGS. 24 and 25, a photoresist film with a thickness of about 1-2 microns is coated on the conductive layer 170, and is exposed to light through an exposure mask and developed to form a photoresist film 52, 54 having a position-dependent thickness.

The developed photoresist films 52 and 54 are portions of the photoresist film of different thicknesses. As shown in FIGS. 24 and 25, the developed photoresist film defines a plurality of portions, referred to herein as the first, second, and third portions. The first portions are located on wire areas A and the second portions are located on channel areas B, indicated by the features of the photoresist film labeled by reference numerals 52 and 54, respectively. The third portions are located on the remaining areas C, where substantially all the photoresist film is removed, thus exposing underlying portions of the conductive layer 170, in particular the upper layer 170r. The thickness ratio of the photoresist film at features 54 and 52 is adjusted depending upon the process conditions in the subsequent process steps. For example, the thickness of the photoresist film at the second portions (i.e., at feature 54) may be equal to or less than half of the thickness of the photoresist film at the first portions (i.e., at feature 52).

The position-dependent thickness of the photoresist is obtained by several techniques, for example, by providing translucent areas on the exposure mask as well as transparent areas and light blocking opaque areas. The translucent areas may have a slit pattern or a lattice pattern, or they may be a thin film(s) with intermediate transmittance or intermediate thickness. When using a slit pattern, it is preferable that the width of the slits or the distance between the slits is smaller than the resolution of a light exposer used for the photolithography. Another example is to use a reflowable photoresist. In detail, once a photoresist pattern made of a reflowable material is formed by using a normal exposure mask with only transparent areas and opaque areas, it is subject to a reflow process to flow onto areas without the photoresist, thereby forming thin portions.

Referring to FIGS. 26 and 27, the conductive layer 170 of the third portions at remaining areas C are removed by wet etching to expose the underlying extrinsic a-Si layer 160 of the third portions, thus forming data metal pattern 171, 174, 179.

Next, the third portions of the extrinsic a-Si layer 160 on the remaining areas C and of the intrinsic a-Si layer 150 that are not covered by a data metal pattern 171, 174, and 179 are removed, preferably by dry etching.

Next, the second portions 54 of the photoresist on the channel areas B are removed by an etch-back process to expose the second portions of the conductors 174. The removal of the second portions 54 of the photoresist is performed either simultaneously with or independent from the removal of the third portions of the extrinsic a-Si layer 160 and of the intrinsic a-Si layer 150. Residue of the second portions 54 of the photoresist remaining on the channel areas C is removed by ashing. At the same time, some amount of the exposed portions of the photoresist film at the first portion 52 is removed, thereby decreasing the thickness of the remaining photoresist film.

Referring to FIGS. 28 to 30, the data metal pattern 171, 174, and 179 is wet-etched using the first portions 52 of the photoresist as an etch mask, where each conductor 174 is now divided into a data line 171 and a plurality of drain electrodes 175, and the portions of the extrinsic semiconductor stripe 164 between the source electrode 173 and the drain electrode 175 is now exposed.

Next, the first portions 52 of the photoresist are removed.

Then, although not shown in FIG. 28 to 30, the portions of the extrinsic semiconductor stripe 164 between the source electrode 173 and the drain electrode 175 are removed to divide the semiconductor stripe 164 into an ohmic contact stripe 161 and a plurality of ohmic contact islands 165 and to expose the underlying portion of the projections 154 of the semiconductor stripes 151. Alternatively, the removal of the portions of the extrinsic semiconductor stripe 164 may be formed without or prior to the removal of the first portions 52 of the photoresist.

Referring to FIGS. 31 to 33, a passivation layer 180 is formed to cover the projections 154 that are not covered by the data lines 171 and the drain electrodes 175. Thereafter, selected portions of the passivation layer 180 and the gate insulating layer 140 are patterned to form a plurality of contact holes 181, 182, 183a, 183b, and 185.

Finally, with reference again to FIGS. 16 to 18, a plurality of pixel electrodes 190, a plurality of contact assistants 81 and 82, and a plurality of overpasses 83 are formed on the passivation layer 180 by sputtering and patterning to form an ITO or IZO layer.

FIG. 34 is a graph showing skews of the gate lines and the data lines etched by using the etchant described above according to the exemplary embodiment of the present invention, and FIG. 35 is a photograph showing remnants and tails of the gate lines and the data lines etched by using the etchant according to the exemplary embodiment of the present invention.

In these embodiments according to the present invention, the gate lines and the data lines were formed of a double layer of a lower Mo layer/an upper Cu layer (Mo/Cu), a quadruple layer of a first Mo layer/a second Cu layer/a third Cu—N alloy layer/a fourth Cu layer (Mo/Cu/CuN/Mo), which are sequentially layered, or a double layer of a lower Mo—Nb alloy layer/an upper Cu layer (MoNb/Cu), and were etched with various etch conditions to detect the skews, the remnants, and the tails.

Here, the skews represent the errors between photoresist patterns as an etch mask and the gate and data lines that were patterned by using the photoresist patterns as an etch mask.

As shown in FIG. 34, when the gate lines and the data line were formed of double layers of a lower Mo layer/an upper Cu layer (Mo/Cu), and the quadruple layer of a first Mo layer/a second Cu layer/a third Cu—N alloy layer/a fourth Cu layer (Mo/Cu/CuN/Mo), the skews were large in the range of about 1.1 to 2.75 microns. However, when the gate lines and the data lines were formed of a double layer of a lower Mo—Nb alloy layer/an upper Cu layer (MoNb/Cu) according to the exemplary embodiment of the present invention, the skews were remarkably decreased in the range of about 0.95 to 1.47 microns. Also, though the gate and data lines are etched under the same etch conditions, the skews were remarkably decreased.

Furthermore, as shown in FIG. 35, when the gate lines and the data lines were formed of double layers of a lower Mo layer/an upper Cu layer (Mo/Cu), and the quadruple layer of a first Mo layer/a second Cu layer/a third Cu—N alloy layer/a fourth Cu layer (Mo/Cu/CuN/Mo), a lot of the remnants and the tails were generated. However, when the gate lines and the data lines were formed of a double layer of a lower Mo—Nb alloy layer/an upper Cu layer (MoNb/Cu) according to the exemplary embodiment of the present invention, few remnants and tails remained.

As above-described, the signal lines are formed of a double layer including a lower Mo—Nb alloy layer/an upper Cu layer, and accordingly the contact characteristics of the upper layer may be reinforced, and the remnants and the skews may be greatly decreased in manufacturing processes such that the reliability for the material of the signal lines may be improved.

While the above exemplary embodiments have been described with reference to a bottom gate structure, it should be understood that the signal lines formed of a double layer including a lower Mo—Nb alloy layer/an upper Cu layer may also be advantageously formed within a TFT array panel having a top gate structure.

While the present invention has been described in detail with reference to the preferred and exemplary embodiments, those skilled in the art will appreciate that various modifications and substitutions can be made thereto without departing from the spirit and scope of the present invention as set forth in the appended claims.

What is claimed is:

1. A method for forming a thin film transistor array panel, the method comprising:
    forming a gate line on a substrate;
    forming a gate insulating layer on the gate line;
    forming a semiconductor layer on the gate insulating layer;
    forming a data line, including a source electrode, and a drain electrode on the gate insulating layer or the semiconductor layer; and
    forming a pixel electrode connected to the drain electrode,
    wherein at least one of the gate line and the data line and drain electrode includes a first conductive layer made of a molybdenum Mo-niobium Nb alloy and a second conductive layer made of a copper Cu-containing metal,
    wherein the first and second conductive layers are etched with one etch condition, and
    wherein the etch condition is wet etching, and an etchant of the wet etching includes benzotriazole, citric acid, hydrogen peroxide, hydrofluoric acid, and deionized water.

2. The method of claim 1, wherein the first conductive layer is disposed under the second conductive layer.

3. The method of claim 2, wherein at least one of the gate line and the data line and drain electrode further comprises:
    a third conductive layer made of a molybdenum Mo-niobium Nb alloy and disposed on the second conductive layer.

4. The method of claim 1, wherein the etchant includes benzotriazole at about 0.1 to 1 wt %, citric acid at about 1 to 5 wt %, hydrogen peroxide at about 10 to 20 wt %, hydrofluoric acid at about 0.01 to 0.5 wt %, and deionized water for a remainder of the etchant.

* * * * *